(12) United States Patent
Wendling et al.

(10) Patent No.: US 8,479,133 B2
(45) Date of Patent: Jul. 2, 2013

(54) METHOD OF AND CIRCUIT FOR IMPLEMENTING A FILTER IN AN INTEGRATED CIRCUIT

(75) Inventors: Xavier Wendling, Montbonnot-Saint-Martin (FR); James M. Simkins, Park City, UT (US)

(73) Assignee: Xilinx, Inc., San Jose, CA (US)

( * ) Notice: Subject to any disclaimer, the term of this patent is extended or adjusted under 35 U.S.C. 154(b) by 261 days.

(21) Appl. No.: 12/418,979

(22) Filed: Apr. 6, 2009

(65) Prior Publication Data
US 2010/0192118 A1 Jul. 29, 2010

Related U.S. Application Data

(63) Continuation-in-part of application No. 12/360,836, filed on Jan. 27, 2009.

(51) Int. Cl.
*G06F 17/50* (2006.01)
(52) U.S. Cl.
USPC .......................................................... 716/116
(58) Field of Classification Search
USPC .......................................................... 716/104
See application file for complete search history.

(56) References Cited

U.S. PATENT DOCUMENTS

| | | | |
|---|---|---|---|
| 4,041,461 A | 8/1977 | Kratz et al. |
| 4,075,688 A | 2/1978 | Lynch et al. |
| 4,541,048 A | 9/1985 | Propster et al. |
| 4,638,450 A | 1/1987 | Stoffers |
| 4,639,888 A | 1/1987 | Nussbaecher |
| 4,665,500 A | 5/1987 | Poland |
| 4,680,628 A | 7/1987 | Wojcik et al. |
| 4,755,962 A | 7/1988 | Mor |
| 4,779,220 A | 10/1988 | Nukiyama |
| 4,780,842 A | 10/1988 | Morton et al. |
| 5,095,523 A | 3/1992 | Delaruelle et al. |
| 5,162,666 A | 11/1992 | Tran |
| 5,165,034 A | 11/1992 | Kanuma |
| 5,241,492 A | 8/1993 | Girardeau, Jr. |

(Continued)

FOREIGN PATENT DOCUMENTS

| | | |
|---|---|---|
| GB | 2 365 636 A | 2/2002 |
| GB | 2 373 883 A | 10/2002 |

(Continued)

OTHER PUBLICATIONS

Xilinx, "XtremeDSP DSP48A for Spartan-3A DP FPGAs User Guide" v1.3, Jul. 15, 2008.*

(Continued)

*Primary Examiner* — Vuthe Siek
*Assistant Examiner* — Aric Lin
(74) *Attorney, Agent, or Firm* — John J. King

(57) ABSTRACT

According to an embodiment of the invention, a method of configuring a filter in a circuit to be implemented in an integrated circuit is disclosed. The method comprises receiving a high level design of the circuit; identifying a filter in the high level design; analyzing coefficients of the filter; and transforming the filter of the high level design to a filter using a processing block of the circuit configured to accommodate a common coefficient, wherein the processing block is coupled to receive taps associated with the common coefficient. A computer program product and a circuit for configuring a filter in a circuit to be implemented in an integrated circuit are also disclosed.

20 Claims, 9 Drawing Sheets

U.S. PATENT DOCUMENTS

| | | | |
|---|---|---|---|
| 5,258,939 A | 11/1993 | Johnstone et al. | |
| 5,317,530 A | 5/1994 | Toriumi | |
| 5,329,460 A | 7/1994 | Agrawal et al. | |
| 5,339,264 A * | 8/1994 | Said et al. | 708/319 |
| 5,349,250 A | 9/1994 | New et al. | |
| 5,359,536 A | 10/1994 | Agrawal et al. | |
| 5,388,062 A | 2/1995 | Knutson | |
| 5,450,056 A | 9/1995 | Jens | |
| 5,450,339 A | 9/1995 | Chester et al. | |
| 5,455,525 A | 10/1995 | Ho et al. | |
| 5,506,799 A | 4/1996 | Nakao | |
| 5,524,244 A | 6/1996 | Robinson et al. | |
| RE35,311 E | 8/1996 | Vassiliadis et al. | |
| 5,570,306 A | 10/1996 | Soo | |
| 5,572,207 A | 11/1996 | Harding et al. | |
| 5,581,357 A * | 12/1996 | Sasaki et al. | 348/235 |
| 5,600,265 A | 2/1997 | El Gamal et al. | |
| 5,606,520 A | 2/1997 | Gove et al. | |
| 5,630,160 A | 5/1997 | Simpson et al. | |
| 5,642,382 A | 6/1997 | Juan | |
| 5,724,276 A | 3/1998 | Rose et al. | |
| 5,727,225 A | 3/1998 | Guttag et al. | |
| 5,732,004 A | 3/1998 | Brown | |
| 5,754,459 A | 5/1998 | Telikepalli | |
| 5,805,913 A | 9/1998 | Guttag et al. | |
| 5,809,292 A | 9/1998 | Wilkinson et al. | |
| 5,828,229 A | 10/1998 | Ahanin et al. | |
| 5,835,393 A | 11/1998 | Melanson et al. | |
| 5,838,165 A | 11/1998 | Chatter | |
| 5,847,580 A | 12/1998 | Bapat et al. | |
| 5,880,671 A | 3/1999 | Ranson et al. | |
| 5,883,525 A | 3/1999 | Tavana et al. | |
| 5,896,307 A | 4/1999 | Volkonsky | |
| 5,905,661 A | 5/1999 | Volkonsky | |
| 5,914,616 A | 6/1999 | Young et al. | |
| 5,923,579 A | 7/1999 | Widigen et al. | |
| 5,933,023 A | 8/1999 | Young | |
| 5,943,250 A | 8/1999 | Kim et al. | |
| 5,948,053 A | 9/1999 | Kamiya | |
| 6,000,835 A | 12/1999 | Pan et al. | |
| 6,014,684 A | 1/2000 | Hoffman | |
| 6,038,381 A * | 3/2000 | Munch et al. | 716/104 |
| 6,038,583 A | 3/2000 | Oberman et al. | |
| 6,044,392 A | 3/2000 | Anderson et al. | |
| 6,065,034 A | 5/2000 | Mahurin | |
| 6,069,490 A | 5/2000 | Ochotta et al. | |
| 6,100,715 A | 8/2000 | Agrawal et al. | |
| 6,108,343 A | 8/2000 | Cruickshank et al. | |
| 6,112,019 A | 8/2000 | Chamdani et al. | |
| 6,125,381 A | 9/2000 | Paysan | |
| 6,131,105 A | 10/2000 | Pajarre et al. | |
| 6,134,574 A | 10/2000 | Oberman et al. | |
| 6,154,049 A | 11/2000 | New | |
| 6,204,689 B1 | 3/2001 | Percey et al. | |
| 6,223,198 B1 | 4/2001 | Oberman et al. | |
| 6,243,808 B1 | 6/2001 | Wang | |
| 6,249,144 B1 | 6/2001 | Agrawal et al. | |
| 6,260,053 B1 | 7/2001 | Maulik et al. | |
| 6,269,384 B1 | 7/2001 | Oberman | |
| 6,282,627 B1 | 8/2001 | Wong et al. | |
| 6,282,631 B1 | 8/2001 | Arbel | |
| 6,288,566 B1 | 9/2001 | Hanrahan et al. | |
| 6,298,366 B1 | 10/2001 | Gatherer et al. | |
| 6,298,472 B1 | 10/2001 | Phillips et al. | |
| 6,311,200 B1 | 10/2001 | Hanrahan et al. | |
| 6,323,680 B1 | 11/2001 | Pedersen et al. | |
| 6,341,318 B1 | 1/2002 | Dakhil | |
| 6,347,346 B1 | 2/2002 | Taylor | |
| 6,349,346 B1 | 2/2002 | Hanrahan et al. | |
| 6,362,650 B1 | 3/2002 | New et al. | |
| 6,366,943 B1 | 4/2002 | Clinton | |
| 6,370,596 B1 | 4/2002 | Dakhil | |
| 6,374,312 B1 | 4/2002 | Pearce et al. | |
| 6,385,751 B1 | 5/2002 | Wolf | |
| 6,389,579 B1 | 5/2002 | Phillips et al. | |
| 6,392,912 B1 | 5/2002 | Hanrahan et al. | |
| 6,397,238 B2 | 5/2002 | Oberman et al. | |
| 6,405,298 B1 | 6/2002 | Zeng | |
| 6,421,698 B1 | 7/2002 | Hong | |
| 6,434,584 B1 | 8/2002 | Henderson et al. | |
| 6,438,570 B1 | 8/2002 | Miller | |
| 6,448,808 B2 | 9/2002 | Young et al. | |
| 6,449,708 B2 | 9/2002 | Dewhurst et al. | |
| 6,457,116 B1 | 9/2002 | Mirsky et al. | |
| 6,483,343 B1 | 11/2002 | Faith et al. | |
| 6,496,918 B1 | 12/2002 | DeHon et al. | |
| 6,499,045 B1 * | 12/2002 | Turney et al. | 708/401 |
| 6,519,674 B1 | 2/2003 | Lam et al. | |
| 6,526,430 B1 | 2/2003 | Hung et al. | |
| 6,526,557 B1 | 2/2003 | Young et al. | |
| 6,530,010 B1 | 3/2003 | Hung et al. | |
| 6,538,470 B1 | 3/2003 | Langhammer et al. | |
| 6,539,477 B1 | 3/2003 | Seawright | |
| 6,556,044 B2 | 4/2003 | Langhammer et al. | |
| 6,567,835 B1 | 5/2003 | Blomgren et al. | |
| 6,573,749 B2 | 6/2003 | New et al. | |
| 6,631,508 B1 | 10/2003 | Williams | |
| 6,693,455 B2 | 2/2004 | Langhammer et al. | |
| 6,728,744 B2 | 4/2004 | Amer | |
| 6,731,706 B1 | 5/2004 | Acharya et al. | |
| 6,732,132 B2 | 5/2004 | Sogo | |
| 6,742,013 B2 | 5/2004 | Griesemer | |
| 6,745,319 B1 | 6/2004 | Balmer et al. | |
| 6,754,689 B2 | 6/2004 | Bhushan et al. | |
| 6,820,102 B2 | 11/2004 | Aldrich et al. | |
| 6,864,714 B2 | 3/2005 | Digari | |
| 6,873,182 B2 | 3/2005 | Mohan et al. | |
| 6,904,446 B2 | 6/2005 | Dibrino | |
| 6,920,627 B2 | 7/2005 | Blodget et al. | |
| 6,925,480 B2 | 8/2005 | Duborgel | |
| 6,947,916 B2 | 9/2005 | Luo et al. | |
| 7,116,663 B2 | 10/2006 | Liao | |
| 7,124,156 B2 | 10/2006 | Yang et al. | |
| 7,124,160 B2 | 10/2006 | Saulsbury et al. | |
| 7,129,762 B1 | 10/2006 | Vadi | |
| 7,142,010 B2 | 11/2006 | Langhammer et al. | |
| 7,174,432 B2 | 2/2007 | Howard et al. | |
| 7,178,130 B2 | 2/2007 | Chuang et al. | |
| 7,193,433 B1 | 3/2007 | Young | |
| 7,194,598 B2 | 3/2007 | Jacob | |
| 7,194,605 B2 | 3/2007 | Ranchandran | |
| 7,197,686 B2 | 3/2007 | Box et al. | |
| 7,218,139 B1 | 5/2007 | Young et al. | |
| 7,225,279 B2 | 5/2007 | Scheuermann | |
| 7,230,451 B1 | 6/2007 | Langhammer | |
| 7,249,242 B2 | 7/2007 | Ramchandran | |
| 7,340,562 B2 | 3/2008 | Ranchandran | |
| 7,353,243 B2 | 4/2008 | Scheuermann | |
| 7,353,516 B2 | 4/2008 | Heidari-Bateni et al. | |
| 7,433,909 B2 | 10/2008 | Scheuermann | |
| 7,467,175 B2 | 12/2008 | Simkins et al. | |
| 7,467,177 B2 | 12/2008 | Simkins et al. | |
| 7,472,155 B2 | 12/2008 | Simkins et al. | |
| 7,480,690 B2 | 1/2009 | Simkins et al. | |
| 7,483,420 B1 | 1/2009 | Esposito | |
| 7,502,915 B2 | 3/2009 | Jacob | |
| 7,567,997 B2 | 7/2009 | Simkins et al. | |
| 7,580,963 B2 | 8/2009 | Kawano et al. | |
| 7,689,640 B2 | 3/2010 | Renno et al. | |
| 7,702,710 B2 | 4/2010 | Domingo | |
| 7,840,627 B2 | 11/2010 | Simkins et al. | |
| 7,840,630 B2 | 11/2010 | Wong et al. | |
| 7,844,653 B2 | 11/2010 | Simkins et al. | |
| 7,849,119 B2 | 12/2010 | Vadi et al. | |
| 7,853,632 B2 | 12/2010 | Ching et al. | |
| 7,853,634 B2 | 12/2010 | Simkins et al. | |
| 7,853,636 B2 | 12/2010 | New et al. | |
| 7,860,915 B2 | 12/2010 | Vadi et al. | |
| 7,865,542 B2 | 1/2011 | New et al. | |
| 7,870,182 B2 | 1/2011 | Thendean et al. | |
| 7,882,165 B2 | 2/2011 | Simkins et al. | |
| 7,949,699 B1 | 5/2011 | Neoh et al. | |
| 8,010,593 B2 | 8/2011 | Master et al. | |
| 2001/0004741 A1 | 6/2001 | Sogo | |
| 2002/0138538 A1 | 9/2002 | Talwar et al. | |
| 2002/0138716 A1 | 9/2002 | Master et al. | |
| 2003/0033342 A1 | 2/2003 | Griesemer | |

| | | | |
|---|---|---|---|
| 2003/0055861 A1 | 3/2003 | Lai et al. | |
| 2003/0105793 A1 | 6/2003 | Guttag et al. | |
| 2003/0105949 A1 | 6/2003 | Master et al. | |
| 2003/0140077 A1 | 7/2003 | Zaboronski et al. | |
| 2003/0154357 A1 | 8/2003 | Master et al. | |
| 2004/0083250 A1 | 4/2004 | Kiuchi et al. | |
| 2004/0158600 A1 | 8/2004 | Markstein et al. | |
| 2004/0181614 A1 | 9/2004 | Furtek | |
| 2005/0038984 A1 | 2/2005 | Heidari-Bateni et al. | |
| 2005/0144210 A1 | 6/2005 | Simkins et al. | |
| 2005/0144213 A1* | 6/2005 | Simkins et al. | 708/490 |
| 2005/0187998 A1 | 8/2005 | Zheng et al. | |
| 2006/0004902 A1 | 1/2006 | Simanapalli et al. | |
| 2006/0015701 A1 | 1/2006 | Hogenanauer | |
| 2006/0064449 A1 | 3/2006 | Nakamura et al. | |
| 2006/0190516 A1 | 8/2006 | Simkins et al. | |
| 2006/0190518 A1 | 8/2006 | Ekner et al. | |
| 2006/0212499 A1 | 9/2006 | New et al. | |
| 2006/0218216 A1 | 9/2006 | Langhammer et al. | |
| 2006/0253516 A1 | 11/2006 | Gangwal et al. | |
| 2006/0269054 A1 | 11/2006 | Dror et al. | |
| 2006/0294175 A1 | 12/2006 | Koob et al. | |
| 2009/0019416 A1* | 1/2009 | Chugh et al. | 716/18 |

FOREIGN PATENT DOCUMENTS

| | | |
|---|---|---|
| GB | 2 383 435 A | 6/2003 |
| JP | 08-65107 | 3/1996 |
| WO | WO 94/01933 A1 | 1/1994 |
| WO | WO 01/89091 A2 | 11/2001 |
| WO | WO 2005/066832 A2 | 7/2005 |
| WO | WO 2005/110049 A2 | 11/2005 |

OTHER PUBLICATIONS

Parhami, B., "Computer Arithmetic, Algorithms and Hardware Designs", 2000, Oxford University Press, Inc., New York, NY, USA, 239790, XP002570130, 432-443 pp.

U.S. Appl. No. 12/360,836, filed Jan. 27, 2009, Simkins, James M., Xilinx, Inc. 2100 Logic Drive, San Jose, CA.

ISE 10.1 In-Depth Tutorial, 168 pages, May 30, 2008, available at www.xilinx.com, Xilinx, Inc. 2100 Logic Drive, San Jose, CA.

"Xtreme DSP DSP48A for Spartan-3A DSP FPGAs", User Guide, UG431 (v1.3), Jul. 15, 2008, available from Xilinx, Inc., of San Jose, California.

Masud et al., "Reusable Silicon IP Cores for Discrete Wavelet Transform Applications", IEEE Transactions on Circuits and Systems, Part I: Regular Papers IEEE Service Center, NY, NY, vol. 51, No. 6, Jun. 1, 2004, pp. 1114-1124, XP011113915.

Mar, M.F. et al., "Digital filter design for compact on-chip oversampling A/D conversion", IEEE 1993 Custom Integrated Circuits Conference, Proceedings of the IEEE 1993 San Diego, CA, USA, May 9-12, 1993, NY, NY, pp. 15.2.1-15.2.4, XP010222127.

Advanced Micro Devices; "The Am29116 Family"; Bipolar Microprocessor Logic and Interface Data Book; Copyright 1981 Advanced Micro Devices, Inc., pp. 8-3 through 8-20.

Advanced Micro Devices; "The Am29500 Family"; Bipolar Microprocessor Logic and Interface Data Book; Copyright 1985 Advanced Micro Devices, Inc., pp. 71-through 7-96.

Alliance Core; "ARC 32-bit Configurable RISC/DSP Processor" Jul. 3, 2000; Product Specification; ARC International; AR House, United Kingdom; pp. 1-7.

Altera, "Using PLDs for High-Performance DSP Applications", White Paper, WP-STXDSP-1.0; Feb. 2002, Ver. 1.0; Preliminary Information; pp. 1-6.

Altera; "FPGAs Provide Reconfigurable DSP Solutions", White Paper; WP-FPGA/DSP-1.0; Aug. 2002, ver. 1.0; pp. 1-6.

Arithmatica "Contact Arithmatica": downloaded from http://www.arithmatica.com/aplus.html, on Nov. 10, 2003; pp. 1.

Arithmatica; "A+ Fast Carry-Propagate for Adders", downloaded from http://www.arithmatica.com/aplus.html on Nov. 10, 2003; pp. 1-2.

BDTi, Berkeley Design Technology, Inc.; "Choosing a DSP Processor", 1996-2000 Berkeley Design Technology, Inc.; Oct. 1996, pp. 1-8.

BDTi; "Evaluating FPGAs for Communication Infrastructure Applications", 2002 Berkeley Design Technology, Inc.; SDR Forum, Nov. 2002 Conference; pp. 1-6.

Bradshaw, Stephen, J.: "Building a Better DSP Mousetrap: FPGAs DSP Processors, or a combination of both?" Copyright 2001 Traquair Data Systems, Inc.; rev. 1.1.; Nov. 1, 2001: available from www.traquair.com: pp. 1-6.

Chou, Chi-Jui et al., "FPGA Implementation of Digital Filters" Fourth International Conference on Signal Processing Applications and Technology, ICSPAT' 93, Sep. 28-Oct. 1, 1993, Santa Clara, CA USA., pp. 1-9.

David, Raphael et al., "DART: A Dynamically Reconfigurable Architecture Dealing with Future Mobile Telecommunications Constraints"; Parallel and Distributed Processing Symposium; Proceedings International, IPDPS 2002; Copyright 2002 IEEE; Apr. 15-19, 2002; pp. 156-163.

Dhanesha, Hema et al., "Array of arrays Architecture for Parallel floating Point Multiplication": Center for Integrated Systems, Stanford University, 1995 Conference on Advanced Research in VLSI, Chapel Hill, NC, Advanced Research in VLSI, Proceedings, Sixteenth Conference on Volume, Issue, Mar. 27-29, 1995, pp. 150-157.

Evans, Joseph B., "Efficient FIR Filter Architectures Suitable for FPGA Implementation", presented at ISCAS '93 in Chicago, Illinois; pp. 1-6.

Even, Guy et al.; "A Comparison of Three Rounding Algorithms for IEEE Floating-Point Multiplication", Aug. 29, 1998; pp. 1-30.

Eyre, Jennifer, et al., "The Evolution of DSP Processors", a BDTi White Paper; Copyright 2000 Berkeley Design Technology, Inc.; pp. 1-9.

Fried, Rafael, "Algorithms for Power Consumption Reduction and Speed Enhancement in High-Performance Parallel Multipliers", PATMOS-97; Seventh International workshop Program; downloaded from http://www.dice.uci.ac.be/anmarie/patmos_papers/S2/2_1.html on Nov. 10, 2003; pp. 1-11.

Fujioka, Y. et al., "Design of a Reconfigurable Parallel Processor for Digital control Using FPGAs", IEICE Transactions on Electronics, Institute of Electronics Information and communications; vol. E77-C, No. 7; Jul. 1994; pp. 1123-1129.

Ghazal, Naji S. et al.; "Retargetable Estimation for DSP Architecture Selection", Tampere Technology Seminar, Nov. 1999, available from http://www-cad.eecs.berkeley.edu/~naji/Research/; pp. 1-33.

Goslin, Gregory Ray: "A Guide to Using Field Programmable Gate Arrays (FPGAs) for Application-Specific Digital Signal Processing Performance"; 1995 Xilinx, Inc.; v1.0; pp. 1-11.

Harmon, Gary, "Silicon Arithmetic with a 40% Advantage", White Paper, AutoPD; Mar. 19, 2003, pp. 1-3.

Huang, Zhijun, e al., "Low Power Array Multiplier Design by Topology Optimization", Proceeding-SPIE the International Society of Engineering, Dec. 6, 2002, ISSU, Proceeding vol. 4791, pp. 424-435.

Jovanovic-Dolecek, Gordana, et al.; "Design of FIR Lowpass Filters Using Stepped Triangular Approximation": 5$^{th}$ Nordic Signal Processing Symposium, NORSIG 2002, Oct. 4-7, 2002, from Tromso to Trondheim, Norway, pp. 1-4.

Knapp, Steven K.; "Using Programmable Logic to Accelerate DSP Functions", Copyright 1995 by Xilinx, Inc. available from http://www.xilinx.com: pp. 1-8.

Lee, Edward A., "Programmable DSP Architectures: Part II", IEEE ASSP Magazine: Jan. 1989; pp. 4-14.

Leitung: Prof. Dr. Miroslaw Malek; Humbolt-Universitat Zu Berlin, Institute for Informaltik; Lecture 12; ALU (3)—Division Algorithms; Sommersemester 2002; available from www.informatik.hu-berlin.ed/tok/ca: pp. 1-29.

Lim, Yong Ching, et al., "An Efficient Bit-Serial FIR Filter Architecture" supported by Office of Naval Research under Grant N00014-89-J1327, NSF Grant ECS87-13598, by an AT&T Bell Laboratories Graduate Fellowship and by University of Kansas General Research Allocation 3775-20-0038; Presented at ICASSP-90, Apr. 3-6, 1990, Albuquerque, New Mexico, pp. 1-13.

McIlhenny, Robert et al., "On the Implementation of a Three-Operand Multiplier", pp. 1-5, 31$^{st}$ Asilomar Conference on Signals, Systems, and Computers, Pacific Grove, CA, Nov. 2-5, 1997.

Mirsky, E., Dehon, A., "MATRIX: A Reconfigurable Computing Device with Configurable Instruction Distribution (Extended Abstract)", In Proc. IEEE Workshop on FPGAs for Custom Computing Machines, 1996, pp. 1-3.

Mirsky, E., Dehon, A.," MATRIX: A Reconfigurable Computing Architecture with Configurable Instruction Distribution and Deployable Resources", In Proc. IEEE Workshop on FPGAs for Custom Computing Machines, Apr. 17-19, 1996, pp. 1-10.

Mohanakrishnan, Satish et al., "Automatic Implementation of FIR Filters on Field Programmable Gate Arrays", Oct. 7, 1993; supported by Kansas Technology Enterprise Corp.; pp. 1-12.

Nicolaidis, M., et al., "Design of Fault-Secure Parity-Prediction Booth Multipliers"; Design, Automation and Test in Europe, 1998, Proceedings, Volume, Issue, Feb. 23-26, 1998, pp. 7-14.

Palacharla, S., Jouppi N, P., Smith, J. E. "Complexity-effective superscalar processors ", In Proc. The 24th Annual Int. Symp. Computer Architecture, Denver, CO, Jun. 1997, pp. 206-218.

Parhami, Behrooz, et al.; "Parallel Architectures and Adaptation Algorithms for Programmable FIR Digital Filters with Fully Pipelined Data and Control Flows", Journal of Information Science and Engineering 19, 59-74, (2003) ; accepted Apr. 15, 2002; pp. 59-74.

Peterson, Russell, J.; "An Assessment of the Suitability of Reconfigurable Systems for Digital Signal Processing "; A Thesis Submitted to the Department of Electrical and computer Engineering Brigham Young University, Sep. 27, 1995; pp. 1-138.

Reeves, Keith, et al., "Reconfigurable Hardware Accelerator for Embedded DSP" High-Speed Computing, Digital Signal Processing, and Filtering Using Reconfigurable Logic, Proc. SPIE, vol. 2914, 332, Nov. 20, 1996, Boston, MA, pp. 929-933.

Simkins, Jim et al., "A Reconfigurable VME Spread-Spectrum LPI (Low Probability of Intercept) Datalink Receiver/Transmitter Implemented via Reconfigurable DSP Hardware": IEEE Transactions on Acoustics, Speech, and Signal Processing, vol. ASSP-29, No. 2: Apr. 1981; pp. 1-14.

Turney, Robert D., et al., "Modeling and Implementation of DSP FPGA Solutions" 1999 International Conference on Signal Processing Applications and Technology ICSPAT, Nov. 3, 1999, pp. 1-16.

University of Patras—DCT-Hellas; "ESD Best Practice: Pilot Action for Low Power Design—SOFLOPO Low Power Software Development for Embedded Applications ", May 1998; pp. 1-100.

Wilson, Drew, "Chameleon Takes on FPGAs, ASICs", Electronic News; Oct. 29, 2004: downloaded from http://www.reed-electronics.com/electronicnews/article/CA50551:pubdate=10%2F16%2. on Oct. 29, 2004; pp. 1-6.

Xilinx, Inc., "FPGAs and DSP", Nov. 1996, 1-8, available from Xilinx, Inc., 2100 Logic Drive, San Jose, CA USA.

Xilinx, Inc., "The Programmable Logic Data Book 1999," pp. 1-62, available from Xilinx, Inc., 2100 Logic Drive, San Jose, CA USA.

Xilinx, Inc., "Virtex4 FPGA Handbook" Ch. 10 XtremeDSP Design Considerations, Aug. 2, 2004, pp. 461-508, available from Xilinx, Inc., 2100 Logic Drive, San Jose, CA USA.

Xilinx, Inc., "Virtex4 Handbook" Aug. 2, 2004, pp. 1-632, available from Xilinx, Inc., 2100 Logic Drive, San Jose, CA USA.

Xilinx, Inc., Allaire, Bill, et al., "Block Adaptive Filter": Application Note; XAPP 055; Jan. 9, 1997 (Version 1.1); pp. 1-10.available from Xilinx, Inc., 2100 Logic Drive, San Jose, CA USA.

Yu, Hyeong Seok, et al., "Low Area CMOS Multiplication Using Booth Algorithm for IEEE 754 Floating Point Standard"; $6^{th}$ Korean Semiconductor Conference, D-48, Feb. 9, 1999, pp. 1-5, Seoul, Korea.

Written Opinion of the International Search Authority for PCT/US2010/020565, mailed Jul. 27, 2011, retrieved from wipo.org.

Xilinx, Inc., "XtremeDSP Design Considerations Under Guide", v1.2, UG073 Feb. 2005, Xilinx, Inc. 2100 Logic Drive San Jose, CA USA.

* cited by examiner

| INMODE[4] | INMODE[3] | INMODE[2] | INMODE[1] | INMODE[0] | USE_DPORT | Mult. A Port | Mult. B Port |
|---|---|---|---|---|---|---|---|
| 0/1 | 0 | 0 | 0 | 0 | FALSE | A2 | B2/B1 |
| 0/1 | 0 | 0 | 0 | 1 | FALSE | A1 | B2/B1 |
| 0/1 | 0 | 0 | 1 | 0 | FALSE | Zero | B2/B1 |
| 0/1 | 0 | 0 | 1 | 1 | FALSE | Zero | B2/B1 |
| 0/1 | 0 | 1 | 0 | 0 | TRUE | A2 | B2/B1 |
| 0/1 | 0 | 1 | 0 | 1 | TRUE | A1 | B2/B1 |
| 0/1 | 0 | 1 | 1 | 0 | TRUE | Zero | B2/B1 |
| 0/1 | 0 | 1 | 1 | 1 | TRUE | Zero | B2/B1 |
| 0/1 | 1 | 0 | 0 | 0 | TRUE | D+A2 | B2/B1 |
| 0/1 | 1 | 0 | 0 | 1 | TRUE | D+A1 | B2/B1 |
| 0/1 | 1 | 0 | 1 | 0 | TRUE | D1 | B2/B1 |
| 0/1 | 1 | 0 | 1 | 1 | TRUE | D1 | B2/B1 |
| 0/1 | 1 | 1 | 0 | 0 | TRUE | −A2 | B2/B1 |
| 0/1 | 1 | 1 | 0 | 1 | TRUE | −A1 | B2/B1 |
| 0/1 | 1 | 1 | 1 | 0 | TRUE | Zero | B2/B1 |
| 0/1 | 1 | 1 | 1 | 1 | TRUE | Zero | B2/B1 |
| 0/1 | 1 | 1 | 0 | 0 | TRUE | D−A2 | B2/B1 |
| 0/1 | 1 | 1 | 0 | 1 | TRUE | D−A1 | B2/B1 |
| 0/1 | 1 | 1 | 1 | 0 | TRUE | D | B2/B1 |
| 0/1 | 1 | 1 | 1 | 1 | TRUE | D | B2/B1 |

FIG. 8

METHOD OF AND CIRCUIT FOR IMPLEMENTING A FILTER IN AN INTEGRATED CIRCUIT

CROSS-REFERENCE TO RELATED APPLICATION

This application is a continuation-in-part pursuant to 37 C.F.R. §1.53(b) of U.S. patent application Ser. No. 12/360,836 filed Jan. 27, 2009 and entitled "Digital Signal Processing Block with Preadder Stage". The parent application is incorporated by reference herein in its entirety.

FIELD OF THE INVENTION

The present invention relates generally to integrated circuits, and in particular, to a method of and circuit for implementing a filter in an integrated circuit.

BACKGROUND OF THE INVENTION

Integrated circuits comprise a variety of circuit elements which are used to implement a circuit design. The circuit design must be laid out or "placed" according to the types and available locations of the circuit elements of an integrated circuit. That is, the components of the circuit design must be assigned or placed in sites of an integrated circuit. In placing components of the circuit design, various factors are considered in deciding on the placement. Efficiency in placing components and improving the efficiency of implementing the components may lead to significant improvements in the use of the integrated circuit devices.

While conventional integrated circuits are inefficient when implementing arithmetic operations typical of digital signal processing (DSP) applications, some integrated circuits may employ circuit blocks which are dedicated to implement DSP functions. However, DSP blocks in conventional devices may lead to inherently inefficient layouts or may lead to inefficient usage of circuits needed to implement the DSP application. That is, an integrated circuit having a DSP block which provides limited functions may result in an inefficient use of circuit resources. A DSP block which may improve the efficiency of a circuit layout may result in significant improvements in the use of the integrated circuit.

SUMMARY OF THE INVENTION

According to an embodiment of the invention, a method of configuring a filter in a circuit to be implemented in an integrated circuit is disclosed. The method comprises receiving a high level design of the circuit; identifying a filter in the high level design; analyzing coefficients of the filter; and transforming the filter of the high level design to a filter using a processing block of the circuit configured to accommodate a common coefficient, wherein the processing block is coupled to receive taps associated with the common coefficient. Transforming the filter of the high level design to a filter using a processing block configured to accommodate a common coefficient may comprise configuring the filter as a symmetric transpose convolution filter. Analyzing the coefficients may comprise identifying symmetrical coefficients of the filter. The method may further comprise providing the common coefficient as a first input to a multiplier of the processing block. The method may further comprise providing the sum of the taps associated with the common coefficients as a second input to the multiplier. Coupling the sum of the taps associated with the common coefficients as a second input to the multiplier may comprise generating the sum using a preadder circuit of a DSP block. The method may further comprise providing the difference of taps associated with the common coefficients as a second input to the multiplier.

A computer program product is also disclosed according to an alternate embodiment. The computer program code may comprise a computer-readable medium comprising computer-readable program code that transforms a circuit design to a placement configuration, where the computer-readable medium comprises: computer-readable program code that identifies a filter in a high level design; computer-readable program code that analyzes the coefficients of the filter; and computer-readable program code that configures the filter using a processing block of the circuit configured to accommodate a common coefficient, wherein the processing block is coupled to receive taps associated with the common coefficient.

The computer-readable program code that configures the filter using a processing block configured to accommodate a common coefficient may comprise computer-readable program code that configures the filter as a symmetric transpose convolution filter. The computer-readable program code that analyzes the coefficients of the filter may comprise computer-readable program code that identifies symmetrical coefficients of the filter. The computer program product may further comprise computer-readable program code that provides the common coefficient as a first input to a multiplier of the processing block. The computer program product may further comprise computer-readable program code that provides a sum or difference of the taps associated with the common coefficient as a second input to the multiplier. The computer-readable program code that provides a sum or difference of the taps associated with the common coefficient as a second input to the multiplier may comprise computer-readable program code that generates the sum using a pre-adder circuit of a DSP block. The computer program product may further comprise computer-readable program code that implements the filter using circuit elements of the integrated circuit.

According to a further embodiment, a circuit implementing a filter in an integrated circuit may comprise a plurality of delay elements; a pre-adder circuit coupled to receive a first tap of the filter by way of a first delay element of the plurality of delay elements and a second tap of the filter by way of a second delay element of the plurality of delay elements, wherein the first tap and the second tap have a common coefficient; a multiplier coupled to receive an output of the pre-adder circuit comprising a sum of the first tap and the second tap at a first input and the common coefficient at a second input; and an adder coupled to receive the output of the multiplier. The filter may comprise a transpose convolution filter. The common coefficient may be associated with symmetrical coefficients of the filter. The number of taps of the filter may comprise an even number of taps. The number of taps of the filter may comprise an odd number of taps and a subset of the odd number of taps may be coupled to the pre-adder circuit. The plurality of delay elements, the pre-adder circuit and the multiplier may be a part of a digital signal processing block of the integrated circuit.

BRIEF DESCRIPTION OF THE DRAWINGS

FIG. 8 is a table depicting an exemplary embodiment of an inmode function table according to an embodiment of the present invention;

DETAILED DESCRIPTION OF THE DRAWINGS

Figure 1:
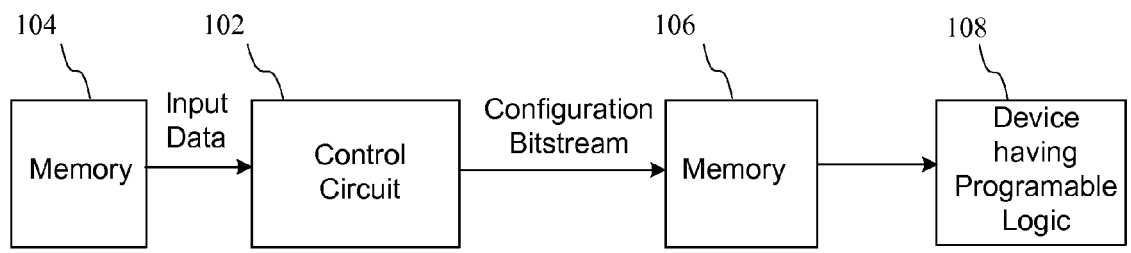
FIG. 1 is a block diagram of a system for implementing a device having programmable logic according to an embodiment of the present invention.

FIG. 1 shows a block diagram of a system 100 for implementing a device having programmable resources according to an embodiment of the present invention. In particular, a control circuit 102 is coupled to receive input data from a memory 104, and generate a configuration bitstream which is stored in a memory 106. As will be described in more detail below, the input data may comprise a circuit design described as a high level design, such as a circuit design defined in a hardware description language (HDL) such as VHDL. The control circuit may comprise a computer running software which generates a configuration bitstream which is stored in the memory 106. The configuration bitstream comprises a placement configuration which provides information related to the placement of components, such as components of DSP circuits of a circuit design to be implemented in a device. Memory 106 comprises a non-volatile memory for storing the configuration bitstream for loading it into an integrated circuit device having programmable resources 108. The programmable resources may be programmable logic as described in more detail below, or other programmable elements of an integrated circuit. While one or more methods of the present invention may be applied to the placement of DSP circuits in any type of integrated circuit, the methods find particular application to devices having programmable logic, and are described in reference to devices having programmable logic in detail below. As will be described in more detail below, the control circuit 102 generates a configuration bitstream having an optimized placement of DSP circuits.

The software flow for the design of a device having programmable resources comprises synthesis, packing, placement and routing, as is well known in the art. Synthesis comprises the step of converting a circuit design in a high level design to a configuration of elements found in the device having programmable logic. For example, a synthesis tool operated by the control circuit 102 may implement the portions of a circuit design implementing certain functions in configurable logic blocks (CLBs) or DSP blocks, as will be described in more detail below. An example of a synthesis tool which may implement one or more methods of the present invention is the ISE™ tool available from Xilinx, Inc. of San Jose Calif., where the output of a synthesis tool implementing one or more methods of the present invention comprises a configuration bitstream having an optimized configuration of DSP blocks. Packing comprises the step of grouping portions of the circuit design into defined blocks of the device, such as configurable logic blocks. As will be described in more detail below, the packing of DSP circuits into DSP blocks may be implemented efficiently according to various methods of the present invention. Placing comprises the step of determining the location of the blocks of the device defined during the packing step, where the blocks in a design are placed on the two-dimensional grid associated with sites of the device. Placement is performed by a placer, which may comprise placement software running on a computer, or a portion of a larger software package running on a computer for implementing the circuit design in the device. Finally, routing comprises selecting paths of interconnect elements, such as programmable interconnects, in a device having programmable logic.

One or more circuits and methods of the present invention enable an implementation of symmetric transpose convolution filters that optimally uses a pre-adder capability, while removing the need for any logic outside of the DSP blocks. As a result, resource requirements and power dissipation are reduced compared to other filter implementations such as a symmetric systolic FIR filter, or other circuits implementing symmetric transpose convolution filters. In addition, the circuits and methods set forth below solve the need for designers to manually fine-tune the description of the filters used in their circuits by introducing a methodology that will allow a synthesis tool to take a generic high level design description of a filter and to perform the fine tuning and optimization work automatically through enhanced capabilities to infer the filter design.

One or more circuits and methods of the present invention enable a symmetric transpose convolution filter implementation that is not only minimal in terms of required DSP stages, but also removes the need for any logic outside the DSP blocks. The circuits and methods therefore further reduce device utilization and static and dynamic power dissipation. For designers that either lack deep knowledge of the characteristics of the DSP blocks, or that are looking for portable solutions which would not tie them to a particular device or device manufacturer, the ability of a synthesis tool to take some generically described filter code, such as HDL code, and perform the transformation to an optimized implementation is beneficial. Therefore, an inference and optimization methodology that can be automated in a synthesis tool is described. As will be described in more detail below, the methodology enables designers leveraging such enabled tools to be able to describe symmetric transpose convolution filters in a generic way. For example, designers may merely describe a sum of products and a table of coefficients to apply to each tap of a given filter to achieve an optimal implementation generated by the synthesis tools.

Figure 2:
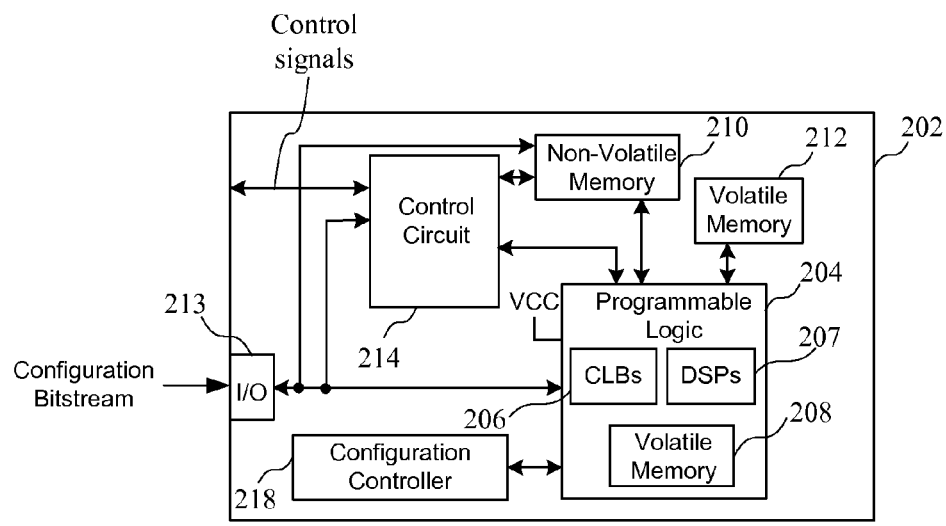
FIG. 2 is a block diagram of a device having programmable logic according to an embodiment of the present invention.

Turning now to FIG. 2, a block diagram of a device having programmable logic according to an embodiment of the present invention is shown. A device 202 incorporates programmable logic 204, where the programmable logic may comprise CLB circuits 206, DSP circuits 207, and volatile memory 208, and may be coupled to other circuits such as a non-volatile memory 210 and/or a volatile memory 212. The non-volatile memory 210 may be coupled to an I/O port 213 of the device, enabling a control circuit 214 to load a configuration bitstream from the I/O port 213 into the non-volatile memory 210 of the device.

The configuration bitstream may be loaded into the non-volatile memory 210 of the device 202, and then loaded into the volatile memory 208 and the volatile memory 212. Alternatively, the configuration bitstream may be loaded directly into the volatile memory 208 and the volatile memory 212 by the control circuit 214 or the configuration controller 218. The volatile memory 208 may be associated with configurable logic blocks, while the volatile memory 212 may be associated with blocks of random access memory (BRAMs) or with configuration memory cells, for example. As will be described in more detail below, a configuration bitstream will be generated to implement the DSP circuits 207 of the programmable logic 204.

Figure 3:
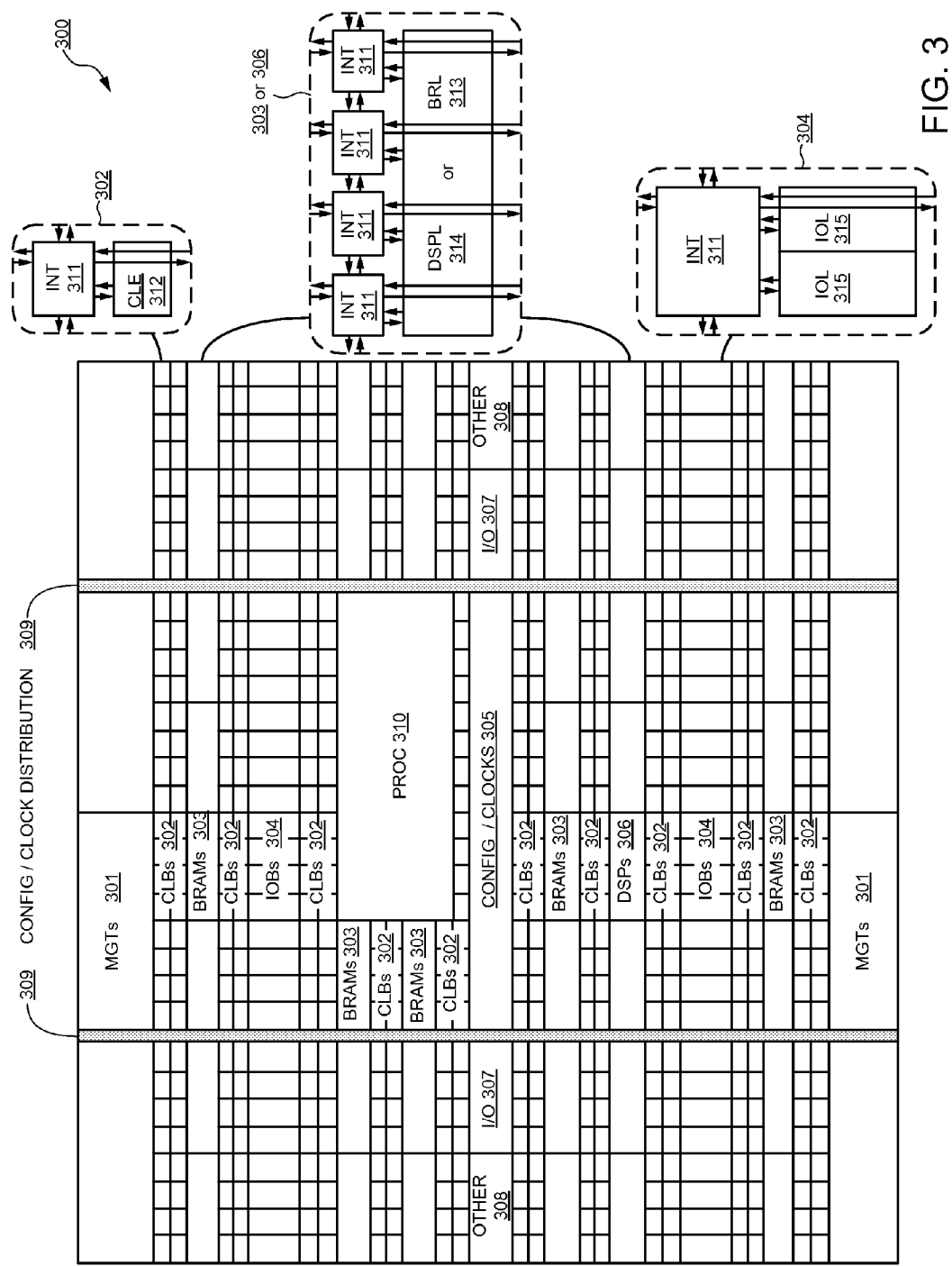
FIG. 3 is a block diagram of a device having programmable logic according to an alternate embodiment of the present invention.

Turning now to FIG. 3, a block diagram of a device having programmable logic according to an alternate embodiment of the present invention is shown. One or more circuits and methods of the present invention as described above with respect to FIGS. 1 and 2 may be implemented in the circuit of FIG. 3. While devices having programmable logic may be implemented in any type of integrated circuit device, such as an application specific integrated circuit (ASIC) having programmable logic, other devices comprise dedicated programmable logic blocks. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration bitstream comprises information related to the placement of blocks, and therefore comprises a placement configuration for the circuit implemented in a particular device. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 3 comprises an FPGA architecture 300 having a large number of different programmable tiles including multi-gigabit transceivers (MGTs) 301, CLBs 302, random access memory blocks (BRAMs) 303, input/output blocks (IOBs) 304, configuration and clocking logic (CONFIG/CLOCKS) 305, digital signal processing blocks (DSPs) 306, specialized input/output blocks (I/O) 307 (e.g., configuration ports and clock ports), and other programmable logic 308 such as digital clock managers, analog-to-digital converters, system monitoring logic, and so forth. Some FPGAs also include dedicated processor blocks (PROC) 310.

In some FPGAs, each programmable tile includes a programmable interconnect element (INT) 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 may include a configurable logic element (CLE) 312 that may be programmed to implement user logic plus a single programmable interconnect element 311. A BRAM 303 may include a BRAM logic element (BRL) 313 in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 306 may include a DSP logic element (DSPL) 314 in addition to an appropriate number of programmable interconnect elements. An IOB 304 may include, for example, two instances of an input/output logic element (IOL) 315 in addition to one instance of the programmable interconnect element 311. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 309 extending from this column are used to distribute the clocks and configuration signals across the breadth of the FPGA. Some FPGAs utilizing the architecture illustrated in FIG. 3 include additional logic blocks that disrupt the regular columnar structure making up a large part of the FPGA. The additional logic blocks may be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

Figure 4:
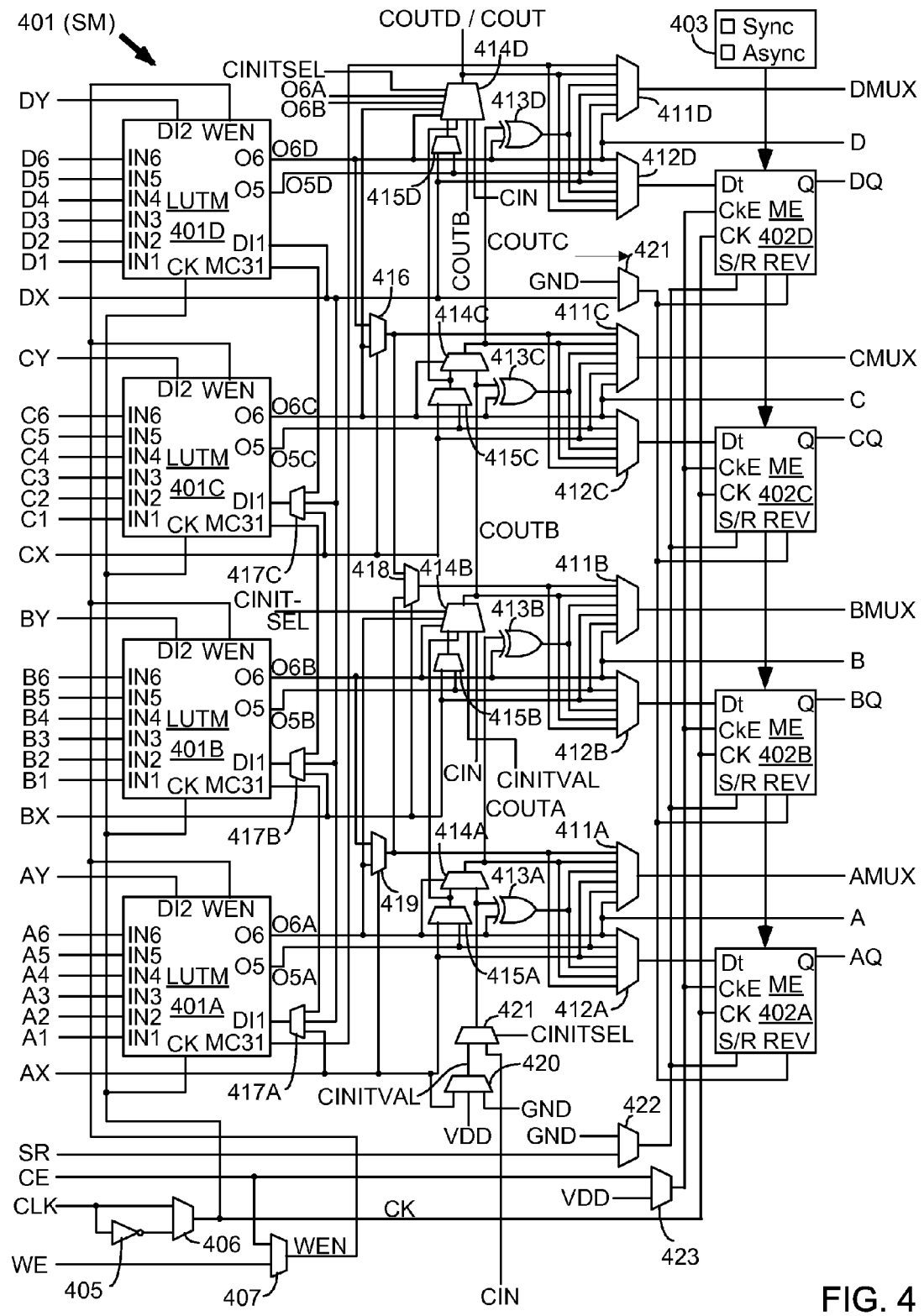
FIG. 4 is a block diagram of a configurable logic element of the device of FIG. 3 according to an embodiment of the present invention.

Turning now to FIG. 4, a block diagram of a configurable logic element of the device of FIG. 3 according to an embodiment of the present invention is shown. In particular, FIG. 4 illustrates in simplified form a configurable logic element of a configuration logic block 302 of FIG. 3. In the embodiment of FIG. 4, slice M 401 includes four lookup tables (LUTMs) 401A-401D, each driven by six LUT data input terminals A1-A6, B1-B6, C1-C6, and D1-D6 and each providing two LUT output signals O5 and O6. The O6 output terminals from LUTs 401A-401D drive slice output terminals A-D, respectively. The LUT data input signals are supplied by the FPGA interconnect structure via input multiplexers, which may be implemented by programmable interconnect element 411, and the LUT output signals are also supplied to the interconnect structure. Slice M also includes: output select multiplexers 411A-411D driving output terminals AMUX-DMUX; multiplexers 412A-412D driving the data input terminals of memory elements 402A-402D; combinational multiplexers 416, 418, and 419; bounce multiplexer circuits 422-423; a circuit represented by inverter 405 and multiplexer 406 (which together provide an optional inversion on the input clock path); and carry logic comprising multiplexers 414A-414D, 415A-415D, 420-421 and exclusive OR gates 413A-413D. All of these elements are coupled together as shown in FIG. 4. Where select inputs are not shown for the multiplexers illustrated in FIG. 4, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 4 for clarity, as well as from other selected figures herein.

In the pictured embodiment, each memory element 402A-402D may be programmed to function as a synchronous or asynchronous flip-flop or latch. The selection between synchronous and asynchronous functionality is made for all four memory elements in a slice by programming Sync/Asynch selection circuit 403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 402A-402D are clocked by a clock signal CK, which may be provided by a global clock network or by the interconnect structure, for example. Such programmable memory elements are well known in the art of FPGA design. Each memory element 402A-402D provides a registered output signal AQ-DQ to the interconnect structure. Because each LUT 401A-401D provides two output signals, O5 and O6, the LUT may be configured to function as two 5-input LUTs with five shared input signals (IN1-IN5), or as one 6-input LUT having input signals IN1-IN6.

In the embodiment of FIG. 4, each LUTM 401A-401D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 417A-417C for LUTs 401A-401C), or to the two 32-bit RAMs via input terminals DI1 and DI2. RAM write operations in the LUT RAMs are controlled by clock signal CK from multiplexer 406 and by write enable signal WEN from multiplexer 407, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 401A may also be provided to the general interconnect structure for shift register chaining, via output select multiplexer 411D and CLE output terminal DMUX.

Figure 5:
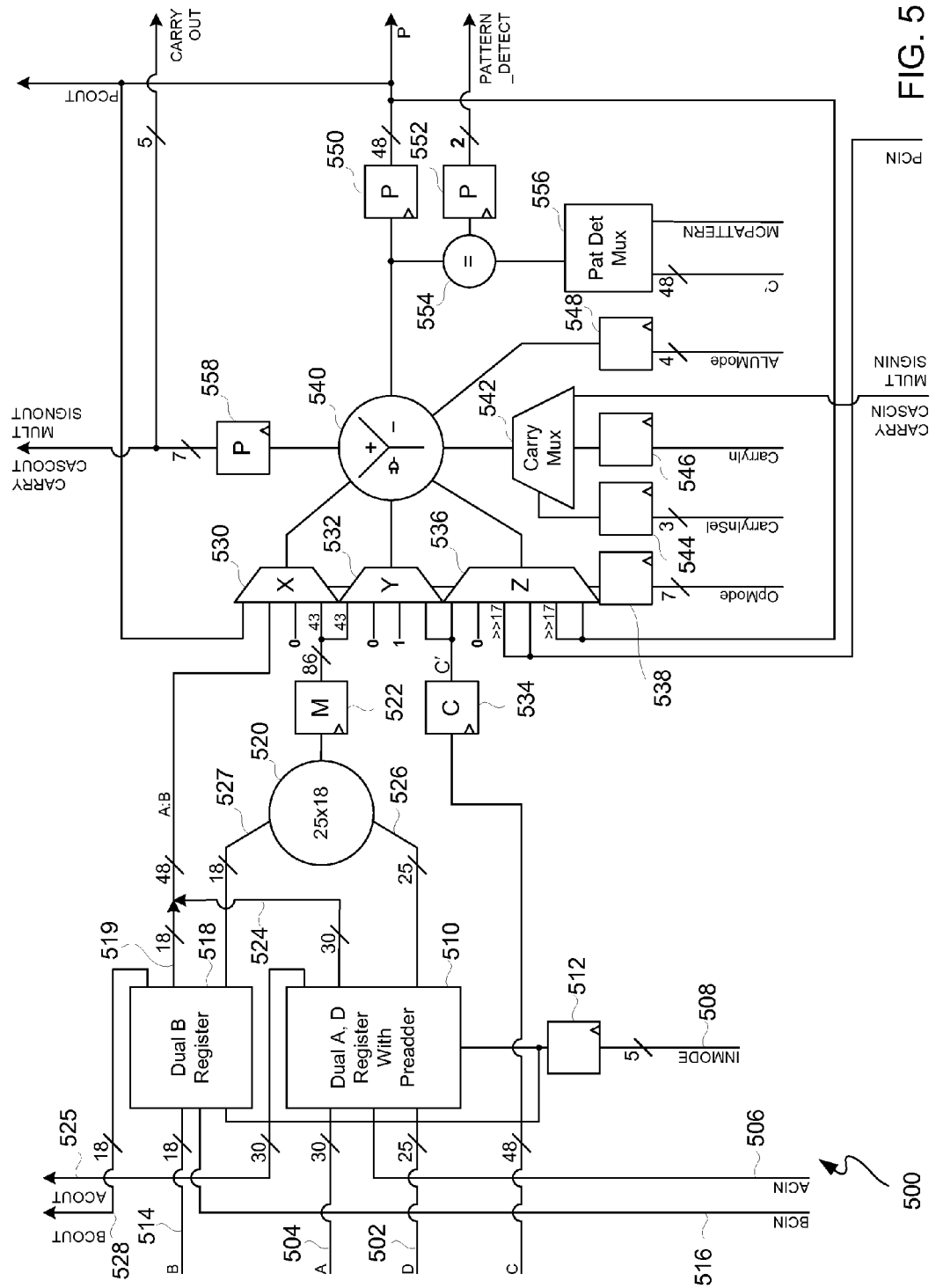
FIG. 5 is a block diagram of a digital signal processing block of the device of FIG. 3 according to an embodiment of the present invention.

Turning now to FIG. 5, a block diagram of a digital signal processing block according to an embodiment of the present invention is shown. DSP slice 500 may, though need not, be an exemplary embodiment of a DSP 306 of FPGA 300 of FIG. 3. D input signal 502, A input 504, AC input ("ACIN") 506, and input mode signal ("inmode") 508, are provided to a dual A, D register with pre-adder ("pre-adder") 510, where inmode 508 is provided to inmode register 512 for pre-adder 510. B input 514 and BC input ("BCIN") 516 are provided to dual B register 518. Multiplier 520 and M register 522 receives outputs of the pre-adder 510. The A output 524 is concatenated with the B output 519 to form an A:B output. The pre-adder 510 also generates an ACOUT signal 525 while the register 518 generates a BCOUT signal 528. An A multiplier signal 526 and a B multiplier signal 527 is coupled to the multiplier 520.

The outputs of the pre-adder 510, the register 518 and the multiplier 520 are coupled to a plurality of multiplexers as shown. In particular, the outputs of the register 518 and the register 522 are coupled to an X multiplexer 530. The output of the M register 522 is coupled to the X multiplexer 530 and a Y multiplexer 532, which is also coupled to receive an output of a C register 534. Finally a Z multiplexer is coupled to receive the output of the C register 534. The X, Y and Z multiplexers are controlled by an opmode signal stored in an opmode register 538. Each of the outputs of the X, Y and Z multiplexers are coupled to an arithmetic block 540, which is also coupled to receive the output of a carry multiplexer 542. The carry multiplexer is controlled by a carry-in select (CarryInSel) signal stored in a register 544 and is coupled to receive a carry-in signal (CarryIn) signal in a register 546 and a carry cascade-in/multiplexer signal-in. The arithmetic block 540 is also coupled to receive an ALU mode (ALU-Mode) signal stored in a register 548. An output register 550 stores an output signal P, while a second register 552 stores an outputs of a comparator 554, which is also coupled to receive the output of a pattern detect multiplexer 556 that selects one of two patterns for the comparator 554. Finally, a register 558 stores a carry cascade/multiplexer signal output. It should be noted that the terms "input" and "output" are used to indicate either or both of a signal and a port, including without limitation their plural forms.

Figure 6:
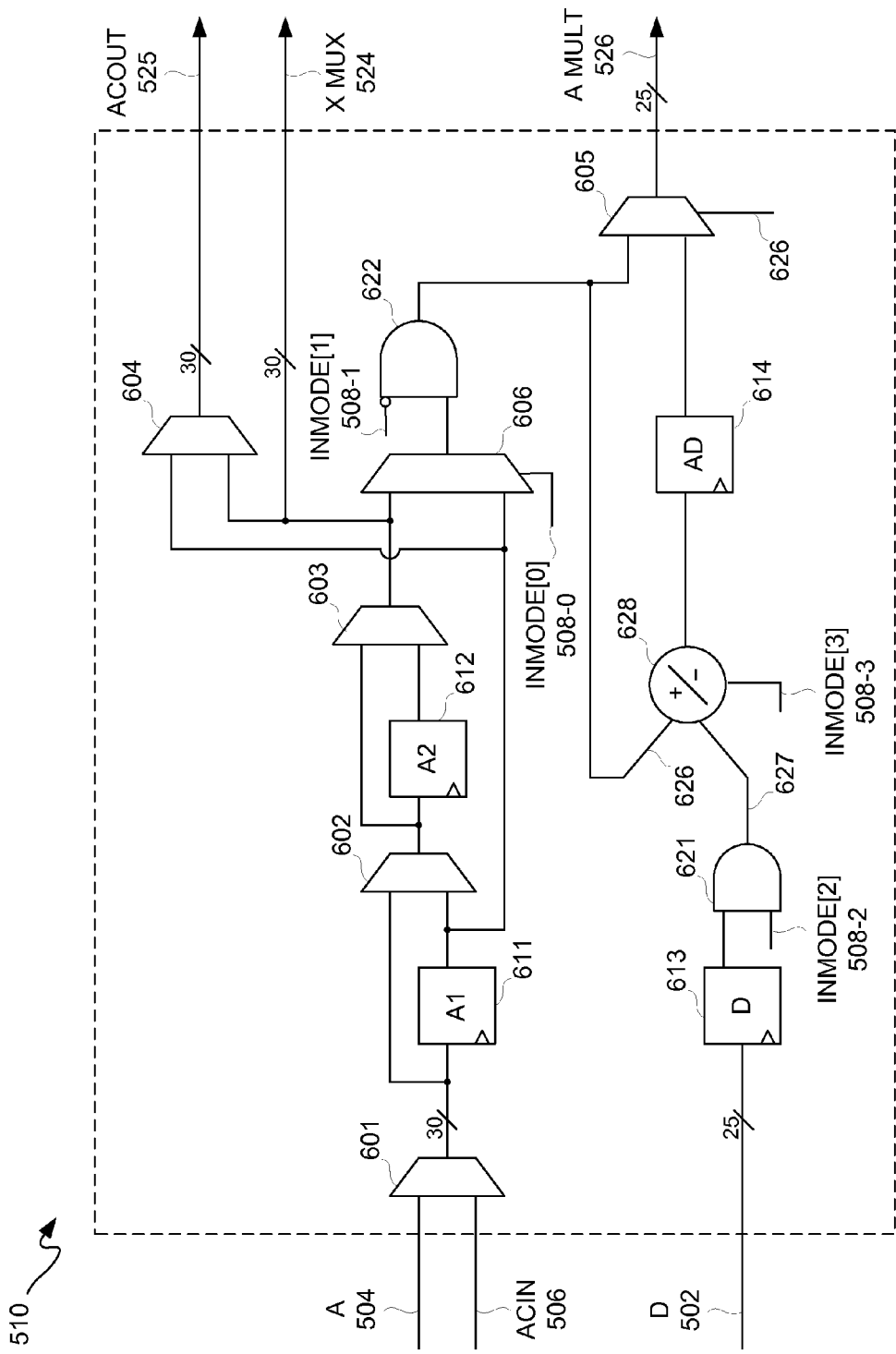
FIG. 6 is a block diagram of a register with a pre-adder of FIG. 5 according to an embodiment of the present invention.

Turning now to FIG. 6, a block diagram of a register with a pre-adder of FIG. 5 according to an embodiment of the present invention is shown. As described below in additional detail, pre-adder 510 may be dynamically configured to operate as being 0, 1, 2, or 3 registers deep. Pre-adder 510 includes multiplexers 601 through 606, registers 611 through 614, logic gates 621 and 622, and adder/subtractor 628. It should be appreciated that while bit widths are illustratively shown in FIG. 6, as well as in FIGS. 5 and 7, in accordance with bit widths of an exemplary DSP block, bit widths other than, or the same as, those shown herein, or a combination thereof, may be used.

Control select inputs to multiplexers 601 through 605 may be provided from configuration memory cells of FPGA fabric which are configured from a configuration bitstream. Thus, in the context of an FPGA, when an FPGA is obtaining state information as part of a power up cycle, the program states of those memory cells determine selected outputs for multiplexers 601 through 605, and such memory cells are not capable of having their state changed without resetting the FPGA. That is, the status of multiplexers 601 through 605 during operation is static. In contrast to the static status of multiplexers 601 through 605 during FPGA operation, multiplexer 606 is dynamically operable. That is, multiplexer 606 may have its control select changed during operation of an FPGA without having to reset the FPGA. Such control select, in this exemplary embodiment, is provided by a portion of inmode 508, namely inmode 508-0, where the "-0" is used to indicate bit position zero of an inmode bus.

Moreover, in addition to dynamic operation of multiplexer 606, logic gates 621 and 622, as well as subtractor 628, may be dynamically operated. Thus, such dynamically operable components may be changed during the operation of a user design. In this embodiment, inmodes 508-0 through 508-3 of FIG. 6, as well as inmode 508-4 of FIG. 7, may be changed on each cycle of a clock signal.

Inmode 508-0 is provided as a dynamic control select signal to multiplexer 606 for gating to provide either A input 504 or AC input 506 as delayed by either of A1 register 611 or A2 register 612, by both A1 register 611 and A2 register 612, or by neither A1 register 611 nor A2 register 612. Again, once selected by memory cell state, a selected output from multiplexers 601 through 605 is static during operation without resetting an FPGA.

Either A input 504 or AC input 506 may be output from multiplexer 601. Output from multiplexer 601 is provided as data input to A1 register 611 and as data input to multiplexer 602. Output of A1 register 611 is provided as data input to multiplexers 602, 604, and 606. Output of multiplexer 602 is provided as data input to A2 register 612 and as data input to multiplexer 603. Output of multiplexer 603 is provided as data input to multiplexers 604 and 606, as well as being provided as an X MUX output 524. Referring to FIG. 5, X MUX output 524 of pre-adder 510 may be combined with output 519 of dual B register 518 of FIG. 5 for a concatenated signal A:B.

Returning to FIG. 6, for purposes of clarity by way of example and not limitation, assuming a user has set multiplexers 602 and 603 to select their bottom inputs as outputs, and assuming that a user has selected AC input 506, namely A cascaded input from another DSP slice, as an output of multiplexer 601, then AC input 506 provided as data input to multiplexer 606 is registered by both A1 register 611 and A2 register 612 on an upper data input of multiplexer 606, and on a lower input of multiplexer 606, AC input 506 is registered by just A1 register 611. Accordingly, it should be appreciated that a user may select the register depth to an upper port of multiplexer 606, while the register depth of input to a lower port of multiplexer 606 is always just A1 deep. The registers provide delays in the path for providing signals to an adder/subtractor of the pre-adder 510 or external to the pre-adder 510. The selection of register depths will be described in more detail in reference to FIGS. 9 and 10.

As previously mentioned, pre-adder 510 includes a dual A register and a dual D register. This means, e.g., that A1 register 611 and A2 register 612 are dual-register configurable, even though both A1 and A2 registers, only one of A1 and A2 registers, or neither of A1 and A2 registers may be used in providing input to logic gate 622 via output of multiplexer 606. Furthermore, the dual D register is in reference to D register 613 and AD register 614.

Again, it should be appreciated that the upper input to multiplexer 606, as well as the lower input to multiplexer 604, sourced from the output of multiplexer 601 may be no registers deep, either A1 or A2 deep, or A1 and A2 deep. Furthermore, again, the lower input of multiplexer 606, as well as the upper input of multiplexer 604, is always A1 deep. Output of multiplexer 604 is AC output ("ACOUT") signal 525 of FIG. 5, which may be provided to another DSP slice, similar to AC input 506 being provided to DSP slice 500 of FIG. 5.

Whether an upper input or a lower input of multiplexer 606 is selected for output is controlled by state of inmode 508-0, and output from multiplexer 606 is provided as data input to logic gate 622. Even though AND gates are illustratively depicted for logic gates 621 and 622, it should be appreciated that other logic gates may be used in accordance with the description herein. The other input of AND gate 622, which is an inverted input, is coupled to receive inmode 508-1. For this embodiment, inmode 508-1 represents bit position one of a bus of inmode 508. Output of AND gate 622 is provided as an input to adder/subtractor 628, namely A path input 504 as described below in additional detail, and to an upper input of multiplexer 605.

D input 502 is provided as data input to D register 613. Data output of D register 613 is provided to an upper input of AND gate 621. A lower input of AND gate 621 is coupled to receive inmode 508-2, which for this embodiment is bit position two of a bus of inmode 508. Output of AND gate 621 is provided as another input to an adder/subtractor 628, namely D path input 627 as described below in additional detail. Whether adder/subtractor 628 is configured for adding or subtracting is controlled by inmode 508-3, which for this embodiment is bit position three of a bus of inmode 508. Output of adder/subtractor 628 is provided to a data input port of AD register 614. Output of AD register 614 is provided as another input to multiplexer 605. Output of multiplexer 605 is a multiplier operand signal, namely A multiplier ("A MULT") signal 526 (illustratively shown in FIG. 5).

Again, it should be appreciated that multiplexer 606, AND gate 622, AND gate 621, adder/subtractor 628 are respectively controlled for purposes of dynamic operation by inmodes 508-0 through 508-3, respectively representing bit positions zero through three of a bus of inmode 508. While inmodes 508-0 and 508-3 are used as control select signals for either selecting an output or a function, inmodes 508-1 and 508-2 are operative by their state for affecting or not affecting the output of AND gates 622 and 621, respectively.

In addition to being able to dynamically control AND gates 621 and 622, output of either of AND gates 621 and 622 may be used to source a zero input to adder/subtractor 628. Accordingly, it should be appreciated that if AND gate 622 provides a zero operand input to adder/subtractor 628, then the input of D input 502 which may be provided as an output of multiplexer 605, may pass through registers 613 and 614, namely a two deep register path. Alternatively, if a zero is sourced from the output of AND gate 621, and adder/subtractor 628 is used, then it is possible to have a three deep register path for either of A input 504 or AC input 506, namely through A1 register 611, A2 register 612, and AD register 614.

Figure 7:
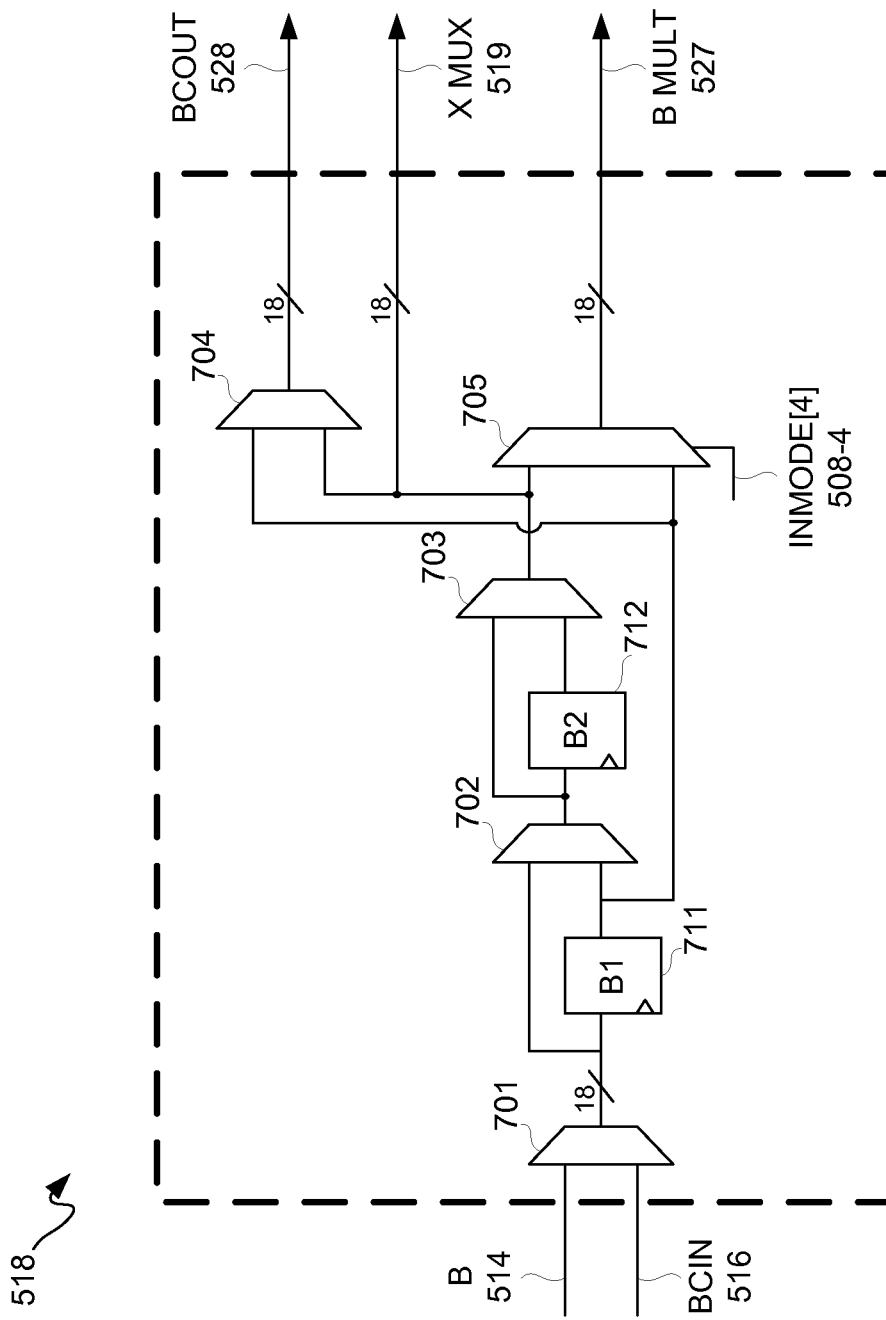
FIG. 7 is a block diagram of another register of FIG. 5 according to an embodiment of the present invention.

Turning now to FIG. 7, a block diagram of a register of FIG. 5 according to an embodiment of the present invention is shown. More particularly, FIG. 7 is a block diagram depicting an exemplary embodiment of dual B register 518 of DSP slice 500 of FIG. 5. B input signal 514 and BC input ("BCIN") signal 516 are provided as inputs to multiplexer 701. Multiplexers 701 through 704 of dual B register 518, like multiplexers 601 through 604, are static during operation, namely their outputs are established during configuration of an FPGA and are not dynamically reconfigurable during operation. Multiplexer 705, like multiplexer 606, is dynamically operable responsive to inmode 508-4, which for this embodiment represents bit position four of a bus of inmode 508. B1 register 711 and B2 register 712 correspond to A1 register 611 and A2 register 612. Likewise, multiplexers 701 through 704 respectively correspond to multiplexers 601 through 604. Furthermore, multiplexer 705 corresponds to multiplexer 606. BC output ("BCOUT") signal 528 (illustratively shown in FIG. 5) from multiplexer 704 corresponds to AC output 525, though for this embodiment with a smaller bit width.

Likewise, X multiplexer ("X MUX") signal 519 corresponds to X multiplexer signal 524, though again with a smaller bit width for this embodiment. It should be appreciated that X multiplexer signals 524 and 519 are AB concatenated as generally indicated as AB signal of FIG. 5 for input to an X multiplexer 530.

Output of multiplexer 705 is another multiplier operand signal, namely B multiplier ("B MULT") signal 527 (illustratively shown in FIG. 5), which corresponds to A multiplier signal 526. B multiplier signal 527 and A multiplier signal 526 for this embodiment have different bit widths; however, both outputs may be provided as input operands to a multiplier 520 of FIG. 5. Because dual B register 518 is same or similar to a dual A register portion of pre-adder 510, repeated description is avoided for purposes of clarity.

With simultaneous reference to FIGS. 5-7, DSP slice 500 is further described. Inmode 508 may be considered a dynamic control bus. In addition to inmode 508, there may be a clock signal, a clock enable signal, a set signal, or a reset signal, among other register control signals. These signals are not shown as going into registers for purposes of clarity and not limitation.

AB concatenated signal A:B does not have M register 522 in its path. Thus, a multiply operation between A and B has three pipeline register stages, and an add operation, such as an addition of AB concatenated ("A:B") and C has two register stages. However, registers 612 and 712 may be used to provide a register pipeline stage which would otherwise be associated with M register 522. That is, the number of pipeline stages for inputs to X multiplexer 530 may be configured to be the same within DSP slice 500, which can be used to avoid register misses, namely "bubbles." Accordingly, by setting an operational mode, as described below in additional detail, an A:B+C operation for example and an A*B+C operation for example may both be performed in three clock cycles, e.g., A1 register 611 to A2 register 612 to a P register of FIG. 5 for an A:B+C operation, and A1 register 611 to M register 522 to a P register of FIG. 5 for A of an A*B+C operation (e.g., likewise B1 register 711 to M register 522 to a P register of FIG. 5). AC register of FIG. 5 has one less register than A and B in both of the above examples, but such difference is predictable for all operational modes and thus may be accounted for in FPGA fabric to add in another register stage for C. It should be understood that this allows for dynamically alternating between multiply and add operation on alternate clock cycles without a bubble.

A1 register 611, and A2 register 612, as well as B1 register 611 and B2 register 612, may be used to provide a register file function. Because of the dynamic control bus function of inmode 508, such register file may operate as a random access register file. Alternatively, A1 register 611, and A2 register 612, as well as B1 register 711 and B2 register 712, may be configured to provide shift register logic ("SRL"). Thus dual functionality of both a random access register file and an SRL is provided within DSP slice 500 using dynamic control via an inmode bus 508, where a bus may mean either a group of signals or a group of signal traces, or both.

Other functionality includes having pre-adder 510 used as a two-to-one multiplexer, namely by having adder/subtractor 628 select between inputs thereto for output to AD register 614 by having one of the operands be zero. In other words, one of outputs of AND gates 622 and 621 may be respectively forced to zero respectively, responsive to inmode 508-1 and 508-2. Additionally, if output of the A input path is a negative, then a zero may be sourced from the operand input along the D path to adder/subtractor 628 such that adder/subtractor 628 may be used to produce an absolute value of an A or AC operand provided to adder/subtractor 628. Furthermore, by shifting bits using A1 and A2 registers, a twos complement inversion may be performed.

Thus, to recapitulate, inmode 508-0 is used as a none/A1/A2 select signal. Inmode 508-1 may be used to generate a zero output along an A register path, namely registers A1 and A2 ("A registers"). In other words, the ability to generate a zero output facilitates multiplexing between the A registers and a D register without using resets and without destroying register contents. When inmode 508-1 is equal to a logic 1, A path input 504 to adder/subtractor 628 is forced to zero, and thus D path input 502 to pre-adder 628 may be effectively selected for output. Additionally, when inmode 508-1 is equal to logic 1, A path input 504 to multiplexer 605 may be used to force A multiplier signal 526 to zero. However, in order to force A multiplier signal 526 to zero, the D port setting 626, namely the configuration memory cell setting for providing a control select signal to multiplexer 605 is set for disabling the D port, namely "if use_D port=false."

Inmode 508-2 may be used to zero output of D register 613 along the lines previously described with respect to inmode 508-1 and output of an A register selected path. Thus, D path input 627 to adder/subtractor 628 would be a logic 0, which may be used for facilitating multiplexing between A path input 626 and D path input 627. Furthermore, inmode 508-1 and inmode 508-2 may be used for dynamic power gating for power conservation. If inmode 508-1 is at a logic 1 state, the A path input 626 to adder/subtractor 627 is forced to 0, and if inmode 508-2 is at a logic 0 state, the D path input 627 to adder/subtractor 628 is forced to 0. If both inputs to adder/subtractor 628 are logic 0, operation of adder/subtractor 628 consumes less power as there is no transistor switching within adder/subtractor 628 under such condition. Thus, by "dynamic power gating," it is meant that both inputs to adder/subtractor 628 may be set to logic zero when adder/subtractor 628 functionality is not selected. By having fixed logic values provided as operand inputs to adder/subtractor 628, adder/subtractor 628 does not switch, and this may be used for dynamic conservation of power. In other words, because inmodes may be dynamically set for dynamically fixing operand inputs to adder/subtractor 628, adder/subtractor functionality may be dynamically selected or deselected, and with respect to the later, dynamic power conservation may be implemented.

Inmode 508-3 may be used to have the A operand of A input path 626 either added to or subtracted from the D operand of D input path 627 by adder/subtractor 628. Again, dynamic inversion of an A operand on A input path 626 may be used as an absolute value function. In other words, a register value held in A1 or A2 for example may be dynamically inverted by having the D operand input 627 forced to zero as previously described. Inmode 508-4 may be used as a B1/B2 register select signal in the same way that inmode 508-0 may be used as an A1/A2 register select signal.

Furthermore, it should be appreciated that complex multiplication operations may be performed, such as (A+ai)*(B+bi)=(AB−ab)+(Ab+aB)i. "A" and "a" may be separate operands respectively input to A2 register 612 and A1 register 611 by using separate clock enable signals provided to those registers, and selectively outputting one of such two operands from multiplexer 606 responsive to inmode 508-0. Likewise, "B" and "b" may be separate operands respectively input to B2 register 712 and B1 register 711 by using separate clock enable signals provided to those registers, and selectively outputting one of such two operands from multiplexer 705 responsive to inmode 508-4. Operands A, B, a, and b may be stored locally in a BRAM. Because of operand reuse, the BRAM is only accessed in bursts of every other two clock cycles by DSP slice 500, and may be read only once for the example complex multiplication operation, as A1, A2, B1 and B2 registers may be used to locally store the real and imaginary parts of such operands. Even though the example of a complex multiplication was used, it should be understood that the same may be said for performing a sequential multiplication, such as (A:a)*(B:b) for example. For purposes of clarity by way of example and not limitation, suppose 42 bits*34 bits is for (A:a)*(B:b), then the result may be obtained by A*B+ sh17(A*0b+B*00000000a+sh17(0b*00000000a), where "sh17" indicates a 17 bit shift.

Turning now to FIG. 8, a table depicting an exemplary embodiment of an inmode function table according to an embodiment of the present invention is shown. FIG. 8 is a table diagram depicting an exemplary embodiment of an inmode function table 800. The first five columns of table 800 respectively show possible logic states of inmode bits four through zero respectively corresponding to inmodes 508-4 through 508-0. Inmode 508-4 is a B2/B1 register select signal, and thus if a logic 0 is the state of inmode 508-4 contents of register B2 may be provided as multiplier B port 527 input, and if inmode 508-4 is a logic state 1, multiplier B port 527 input is the contents of B1 register 711. Accordingly, logic 0 and 1 of the first column of table 800 respectively correspond to B2 and B1 of the last column of table 800.

The sixth column of table 800 indicates programming state of a memory cell used to provide control select control of multiplexer 605 of FIG. 6, which is generally indicated as control select signal 626 (illustratively shown in FIG. 6). Thus, control select signal 626 indicates whether the D port, namely D input 502, is in use. As indicated in the first four rows of table 800, a false value indicates that the D port of pre-adder 510 is not in use. The remaining rows in column 801 indicate a true value for control signal 626 meaning that the D port of pre-adder 510 is in use.

The seventh column of table 800 indicates the operand input on multiplier A port 526. The possible operand inputs illustratively shown are the values held in A1 or A2 for D registers. Additionally, as previously described, a logic 0 may be provided as A multiplier output 526. Furthermore, the value obtained by adding the operand values of D+A2, D+A1, D−A2, or D−A1, as stored in AD register 614 may be provided as A multiplier output 526. The notation A1/A2 and B1/B2 is used to describe one- and two-deep registers, respectively. If A input operands to adder/subtractor 628 are gated off, then registers D 613 and AD 614 in combination appear like a two-deep registration for D port 502. Thus, the notation D1/D2 respectively refers to D/AD registers for one- and two-deep registration, respectively.

It should be understood that DSP slice 500 with the addition of pre-adder 510 and dual B register 518 is capable of supporting sequential complex multiplications, sequential multiplications, and sequential complex conjugate operations. Additionally, the ability to balance the AB concatenation path with the AB multiply path by having A2 and B2 registers essentially be virtual registers with respect to M register 522 allows dynamic switching between multiply and add operations with a three stage pipeline. Furthermore, the ability to dynamically access the A1, A2, B1, and B2 registers for writing to either of two deep input registers or reading from either of two deep input registers is facilitated by inmode 508, as previously described. Moreover, the flexibility to have zero input to either pre-adder input port facilitates a multichannel filters.

Three sets of filter coefficients may be locally stored, such as using A1 register 611, A2 register 612, and D register 613 and being able to switch from symmetric to non-symmetric operations dynamically, namely on each clock cycle. Additionally, it should be appreciated that the AD multiplexing capability of using adder/subtractor 628, when add and subtraction functionality is not needed, is supported for dynamic operations. When three sets of filter coefficient are stored locally, then pre-adder symmetry is not being used. Raw data is being applied via B input port 514 and/or B cascade input port 516 instead of A input port 502 and/or A cascade input port 506, and filter coefficients may be selected by using adder/subtractor 628 to provide a multiplexing function. Thus non-symmetric filters are possible with three sets of filter coefficients.

Figure 9:
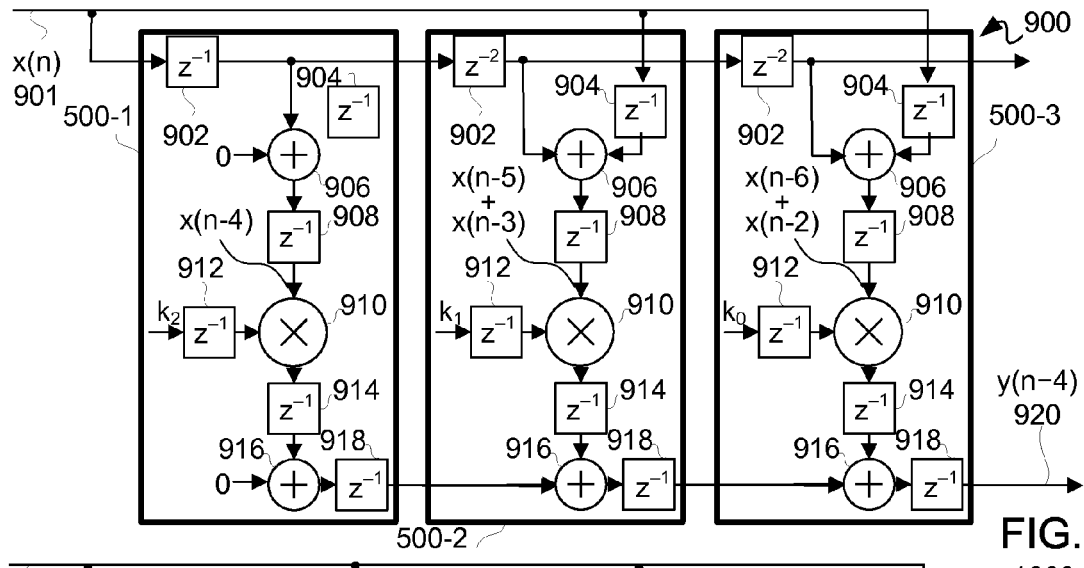
FIG. 9 is a block diagram of a circuit implementing a symmetric transpose convolution finite impulse response filter according to an embodiment of the present invention.

Turning now to FIG. 9, a block diagram of a circuit implementing a symmetric transpose convolution finite impulse response (FIR) filter according to an embodiment of the present invention is shown. The embodiment of FIG. 9 shows an arrangements of DSP blocks, which may comprise DSP blocks 500, configured to enable a symmetric transpose convolution FIR filter using a pre-adder of the DSP block and having registers to provide the delays necessary for taps having a common coefficient to be multiplied by the common coefficient in a single DSP block. The selection of delays comprising registers will depend upon the function of the filter being implemented, where the appropriate delays in the DSP blocks of FIGS. 9-11 may be implemented using the circuit of FIG. 6 set forth above, or some other suitable circuit. While the DSP blocks preferably comprise the same elements, they can be configured differently. By way of example, programmable interconnects, such as the programmable interconnects described above in reference to FIG. 3, may be used to connect the delays as shown or configuration bits may be used to select multiplexers as described in reference to FIG. 6.

Figure 10:
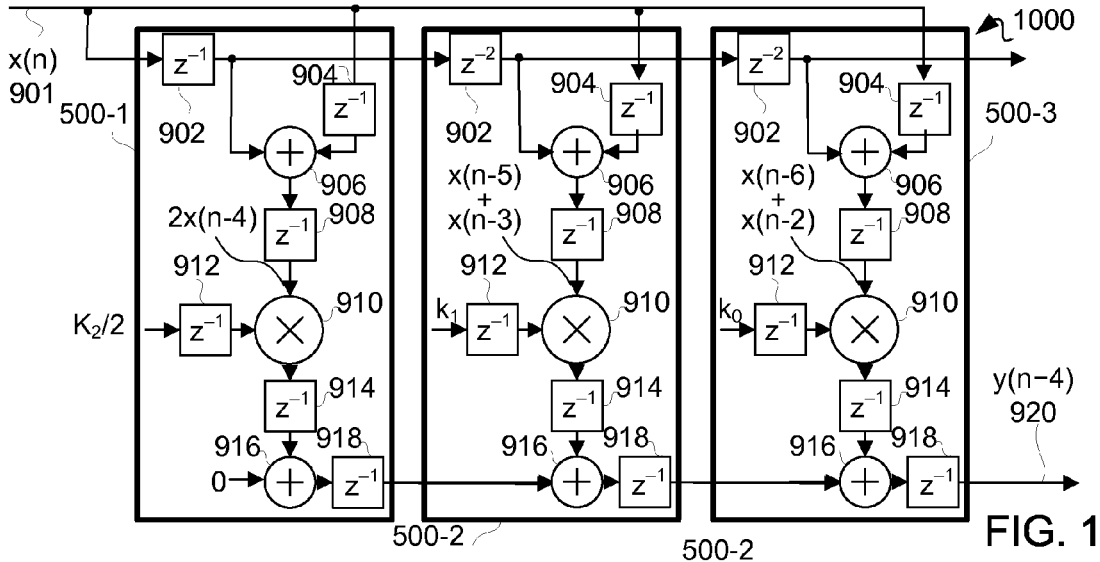
FIG. 10 is a block diagram of a circuit implementing a symmetric transpose convolution finite impulse response filter according to an alternate embodiment of the present invention.

Because the embodiment of FIGS. 9-10 relate to a symmetric transpose convolution FIR filter having an odd number of taps, one of the DSP stages will receive only a single tap, while the other DSP stages will receive a plurality of taps having common coefficients. As configured in FIGS. 9-10, the arrangement and configuration of DSP blocks enables the implementation of a symmetric transpose convolution FIR filter according to the equation $y(n-4)=k_0*x(n-4)+k_1*x(n-5)+k_2*x(n-6)+k_1*x(n-7)+k_0*x(n-8)$, which written in factored form is $k_0\{x(n-4)+x(n-8)\}+k_1\{x(n-5)+x(n-7)\}+k_2*x(n-6)$ or in factored form as $y(n-2)=k_0\{x(n-2)+x(n-6)\}+k_1\{x(n-3)+x(n-5)\}+k_2*x(n-4)$ when expressed in the time frame of the inputs to the multiplier as shown in FIGS. 9 and 10. The raw data index of each filter tap is shown for the inner product computation of y(n−4) result. Thus only the right most tap x(n−2) input to the multiplier 910 aligns with x(n), while the other filter taps show the raw data at different snapshots in time. The delays, where $z^{-1}$ represents one delay and $z^{-2}$ represents two delays, may be implemented according to the Acascade pipeline delays (611 and 612) described above in FIG. 6. For example, the adder 906 may be implemented by the adder/subtractor 628 of FIG. 6, where the selected delay values of the input signals to the adder/subtractor 628 are based upon the selection inputs to the multiplexers of FIG. 6 as set forth above.

In the embodiment of FIG. 9 showing a configuration 900, the first stage 500-1 receives an input 901 comprising an x(n) signal which is coupled to a first register 902. As will be described in more detail below in reference to FIG. 10, a second register 904 may be used. While an adder 906 in the DSP stage 500-1 is shown coupled to receive the output of the register 902 and zero, the adder 906 may be coupled to receive the output of the registers 902 and 904 as shown in DSP stages 500-2 and 500-3, as well as the DSP stage 500-1 in configuration 1000 of FIG. 10. It should be noted that the adder 906 may be implemented as a subtractor to process a coefficient having an inverted sign. A register 908 is coupled to the output of the adder 906 and has an output coupled to a multiplier 910. The multiplier 910 also receives a factor comprising a coefficient from a register 912. A register 914 at the output of the multiplier 910 is also coupled to an adder 916, the output of which is stored in a register 918. While the input to the adder 916 is zero in the first stage 500-1, the adder 916 may receive the output of a previous stage as shown in reference to DSP blocks 500-2 and 500-3. An output 920 comprising a signal y(n−4) is generated at the register 918 of the DSP stage 500-3.

It should be noted that the first stage comprises the middle tap of an odd number of taps and therefore only couples a single tap to the adder 906. However, each of the second and third stages receives two taps having a common coefficient. According to the embodiment of FIG. 9, the second DSP stage 500-2 couples (x(n−5)+x(n−3)) to one input of the multiplier 910 receiving the common coefficient $k_1$, while the third DSP stage 500-3 couples (x(n−6)+x(n−2)) to one input of the multiplier 910 receiving the common coefficient $k_0$. The number of delays associated with the adder 906 or the multiplier 910 are selected to ensure that the correct inputs are received at the adder 906 or multiplier 910. For example, the correct number of delays may be selected by providing the appropriate multiplexer selection signals to the multiplexers of FIG. 6. As shown in FIG. 10, DSP stage 500-1 may be configured to implement register 904, where 2×(n−4) is provided to one input of multiplier 910 while $k_2/2$ is provided to the other input. While the embodiment of FIGS. 9-10 shows one example of a symmetric transpose convolution FIR filter, it should be understood that filters represented by other equations could be implemented. Further, the embodiment of FIGS. 9-10 could be used to implement any function where inputs may have a common coefficient, and may implement any number of factors having a common coefficient.

Figure 11:
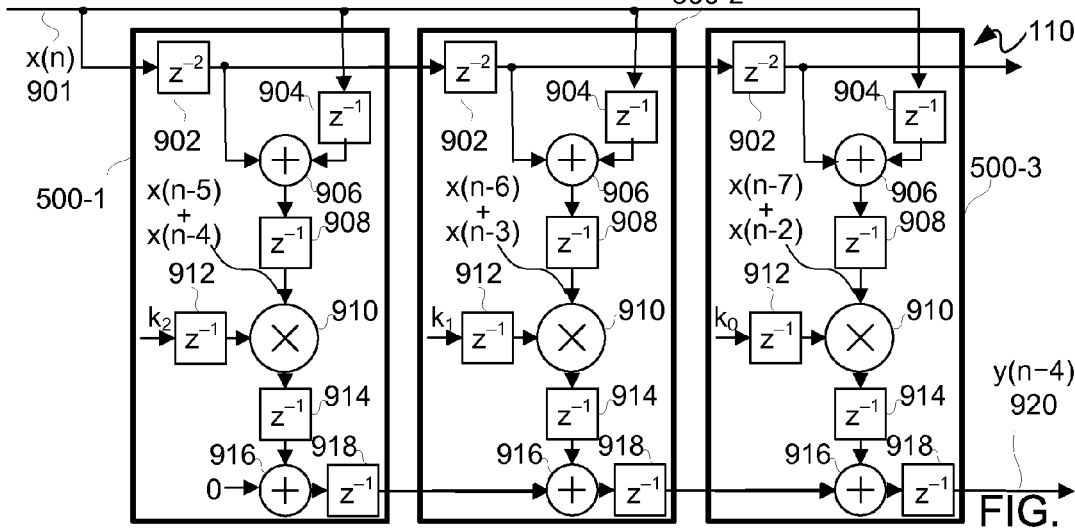
FIG. 11 is a block diagram of a circuit implementing a symmetric transpose convolution finite impulse response filter according to an alternate embodiment of the present invention.

It should be noted that one or more circuits of the present invention function regardless of whether the initial number of taps is even or odd. As shown in the configuration 1100 of FIG. 11, a filter function having an odd number of taps is implemented. In particular, a block diagram of a circuit implementing a symmetric transpose convolution finite impulse response filter shows 6 taps being implemented in 3 DSP blocks according to the equation y(n−4)=$k_0$*x(n−4)+$k_1$*x(n−5)+$k_2$*x(n−6)+$k_2$*x(n−7)+$k_1$*x(n−8)+$k_0$*x(n−9), which written in factored form is y(n−4)=$k_0${x(n−4)+x(n−9)}+$k_1${x(n−5)+x(n−8)}+$k_2${(x−6)+x(n−7)} or in factored from as y(n−2)=$k_0${x(n−2)+x(n−7)}+$k_1${x(n−3)+x(n−6)}+$k_2${x(n−4)+x(n−5)} when expressed in the time frame of the inputs to the multiplier as shown in FIG. 11. As can be seen in FIG. 11, each stage receives two inputs having common coefficients, where the DSP of stage 500-1 receives the taps associated with the coefficient $k_2$, the DSP of stage 500-2 receives the taps associated with the coefficient $k_1$, the DSP of stage 500-3 receives the taps associated with the coefficient $k_0$.

By employing a pre-adder where the arrival of data samples to the pre-adders in the desired clock cycles is controlled through the ACOUT/ACIN propagation path, a filter consuming less device resources and consuming less power may be implemented. That is, rather than implementing the filter of FIGS. 9-10 in five DSP blocks or the filter of FIG. 11 in six DSP blocks, each of the filters may be implemented in three DSP blocks. Further, as will be described in more detail below in reference to FIG. 12, a methodology enables the transformation from a generic, non-optimized, high level description of a filter to the optimized form. This methodology is not only usable by anyone trying to manually describe such filter in an optimal way, but may also be automated as a new advanced inference capability in any synthesis tool. That is, rather than a user providing a description of the DSP block as implemented in FIGS. 9-11 for example, the synthesis tool will automatically detect the symmetric coefficients and configure the DSP block to take advantage of a pre-adder, such as the adder 906, thereby reducing the number of DSP blocks required to implement the filter. Accordingly, one or more circuits and methods of the present invention leverages the symmetry of coefficients to minimize the number of cascaded DSP blocks by using a pre-adder of the DSP to perform symmetric combining.

It should be noted that one or more circuits and methods of the present invention do not result in any penalty in terms of circuit performance compared to other implementations, such as a systolic filter implementation. The DSP block chain is optimized in both cases through the use of fast connections including Pcascade (PCOUT/PCIN) and Acascade (ACOUT/ACIN) between the DSP blocks. In addition, it should be noted that one or more circuits and methods of the present invention ensure that each DSP block in the chain is fully pipelined for optimal performance through the use of available pipelining stages in those blocks, including registers 902, 904, 908, 914 and 918. In addition, a fanout equal to the number of DSP stages is implied in both cases. For a systolic implementation, it is found at the output of the shift register, while it is found on the incoming data node itself for the transpose convolution implementation set forth above.

Finally, it should be noted that the transformation principle is generic, and works when there is a sign inversion between symmetric coefficients, such as coefficients having signs −k2 −k1 −k0 k0 k1 k2 or when there is no sign inversion. Although it may not necessarily address known or common filter applications today, one or more circuits and methods of the present invention could even be applied in mixed situations where some of the coefficients are sign inverted while others are not, such as coefficients having signs of −k2 k1 k0 k0 k1 k2.

Figure 12:
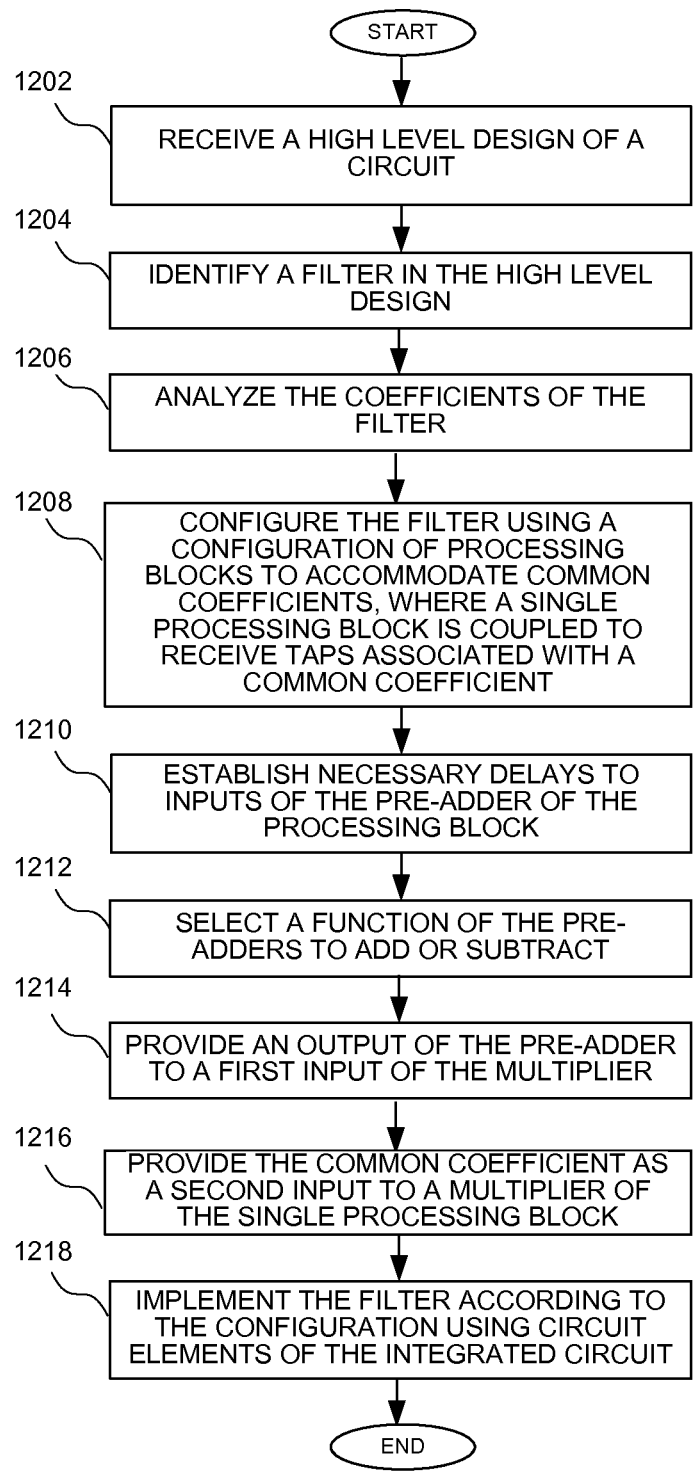
FIG. 12 is a flow chart showing a method of implementing a filter in an integrated circuit according to an embodiment of the present invention.

Turning now to FIG. 12, a flow chart shows a method of implementing a filter in an integrated circuit according to an embodiment of the present invention. The method of FIG. 12 may be implemented in any of the FIGS. 1-11 as described above, or some other suitable circuits. A high level design of a circuit is received at a step 1202. For example, the high level design may be an HDL description or some other high level language description of a circuit having a filter. As set forth above, the description of the filter may be as simple as a description of the filter based upon coefficients and associated taps. A filter in the high level design is identified at a step 1204. The coefficients of the filter are analyzed at a step 1206. The filter is configured using a configuration of processing blocks to accommodate common coefficients, where a single processing block is coupled to receive taps associated with a common coefficient at a step 1208. The configuration of processing blocks may be implemented as shown and described in reference to FIGS. 9-11, for example. Necessary delays to inputs of the pre-adder of the processing block are established at a step 1210. A function of the pre-adders is selected to add or subtract at a step 1212 based upon the signs of the coefficients in an equation representing the filter. An output of the pre-adder is provided to a first input of the multiplier at a step 1214. The common coefficient is provided as a second input to a multiplier of the single processing block at a step 1216. Finally, the filter is implemented according to the configuration using circuit elements of the integrated circuit at a step 1218.

According to one embodiment, a computer program code could be implemented in the control circuit 102 for example. The computer program code may comprise a computer-readable medium having computer-readable program code that transforms a circuit design to a placement configuration, where the computer-readable medium comprises: computer-readable program code that identifies a filter in a high level design; computer-readable program code that analyzes the coefficients of the filter; and computer-readable program code that configures the filter using a processing block of the circuit configured to accommodate a common coefficient, where the processing block is coupled to receive taps associated with the common coefficient.

The computer-readable program code that configures the filter using a processing block configured to accommodate a common coefficient may comprise computer-readable program code that configures the filter as a symmetric transpose convolution filter. The computer-readable program code that analyzes the coefficients of the filter may comprise computer-readable program code that identifies symmetrical coefficients of the filter. The computer program product may further comprise computer-readable program code that provides the common coefficient as a first input to a multiplier of the processing block. The computer program product may further comprise computer-readable program code that provides a sum or difference of the taps associated with the common coefficient as a second input to the multiplier. The computer-readable program code that provides a sum or difference of the taps associated with the common coefficient as a second input to the multiplier may comprise computer-readable program code that generates the sum using a pre-adder circuit of a DSP block. The computer program product may further comprise computer-readable program code that implements the filter using circuit elements of the integrated circuit. The computer program product may have other features or be a part of a larger program for implementing a circuit in an integrated circuit.

It can therefore be appreciated that the new and novel method of and circuit for implementing a filter in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of configuring a filter in a circuit to be implemented in an integrated circuit, the method comprising:
receiving a high level design of the circuit;
identifying a filter in the high level design;
analyzing coefficients of the filter;
transforming, using a computer, the filter of the high level design to a symmetric transpose filter using a plurality of processing blocks, each processing block of the plurality of processing blocks configured to accommodate a common coefficient associated with the processing block, wherein the filter receives an input signal external to the filter at a first processing block and each processing block after the first processing block is configured to receive a different tap associated with the common coefficient for the processing block and the input signal directly at the processing block, and wherein the first processing block receives a highest order coefficient;
implementing, for each processing block of the plurality of processing blocks, a pre-adder circuit having an adder/subtractor coupled to an output of a first logic gate and an output of a second logic gate;
coupling, for each processing block of the plurality of processing blocks, control signals to the adder/subtractor, the first logic gate and the second logic gate;
dynamically selecting, for each processing block of the plurality of processing blocks, whether the adder/subtractor operates as an adder or a subtractor based upon the control signals during operation of the integrated circuit; and
dynamically selecting, for each processing block of the plurality of processing blocks, a register depth to an input port of the first logic gate based upon the control signals during operation of the integrated circuit;
wherein a second input port of the first logic gate and a third input port of the second logic gate enable dynamic power gating of the pre-adder circuit to enable power conservation.

2. The method of claim 1 wherein transforming the filter of the high level design to a symmetric transpose filter using a plurality of processing blocks comprises configuring the filter as a symmetric transpose convolution filter.

3. The method of claim 1 wherein analyzing the coefficients comprises identifying symmetrical coefficients of the filter in the high level design.

4. The method of claim 1 further comprising providing the common coefficient as a first input to a multiplier of the processing block.

5. The method of claim 4 further comprising providing a sum of taps associated with the common coefficient as a second input to the multiplier.

6. The method of claim 5 wherein coupling the sum of the taps associated with the common coefficient as a second input to the multiplier comprises generating the sum using the pre-adder circuit of a DSP block.

7. The method of claim 4 further comprising providing a difference of taps associated with the common coefficient as a second input to the multiplier.

8. A computer program product comprising:
a non-transitory computer-readable medium comprising computer-readable program code that transforms a circuit design to a placement configuration, the non-transitory computer-readable medium comprising:
computer-readable program code that identifies a filter in a high level design;
computer-readable program code that analyzes a coefficients of the filter; and
computer-readable program code that configures the filter as a symmetric transpose filter using a plurality of processing blocks, each processing block of the plurality of processing blocks configured to accommodate a common coefficient associated with the processing block, wherein the filter receives an input signal external to the filter at a first processing block and each processing block after the first processing block is configured to receive a different tap associated with the common coefficient for the processing block and the input signal directly at the processing block, and wherein the first processing block receives a highest order coefficient;
computer-readable program code that implements, for each processor processing block of the plurality of processing blocks, a pre-adder circuit having an adder/subtractor coupled to an output a first logic gate and an output of a second logic gate;
computer-readable program code that enables coupling, for each processing block of the plurality of processing blocks, control signals to the adder/subtractor, the first logic gate and the second logic gate;

computer-readable program code that enables dynamically selecting, for each processing block of the plurality of processing blocks, whether the adder/subtractor operates as an adder or a subtractor based upon the control signals during operation of an integrated circuit; and computer-readable program code that enables dynamically selecting, for each processing block of the plurality of processing blocks, a register depth to an input port of the first logic gate based upon the control signals during operation of the integrated circuit;

wherein a second input port of the first logic gate and a third input port of the second logic gate provide dynamic power gating of the pre-adder circuit to enable power conservation.

9. The computer program product of claim 8 wherein the computer-readable program code that configures the filter as a symmetric transpose filter using a plurality of processing blocks comprises computer-readable program code that configures the filter as a symmetric transpose convolution filter.

10. The computer program product of claim 8 wherein the computer-readable program code that analyzes the coefficients of the filter comprises computer-readable program code that identifies symmetrical coefficients of the filter.

11. The computer program product of claim 8 further comprising computer-readable program code that provides the common coefficient as a first input to a multiplier of the processing block.

12. The computer program product of claim 11 further comprising computer-readable program code that provides a sum or difference of the taps associated with the common coefficient as a second input to the multiplier.

13. The computer program product of claim 12 wherein the computer-readable program code that provides the sum or difference of the taps associated with the common coefficient as a second input to the multiplier comprises computer-readable program code that generates the sum or difference using a pre-adder circuit of a DSP block.

14. The computer program product of claim 8 further comprising computer-readable program code that implements the symmetric transpose filter according to the placement configuration using circuit elements of the integrated circuit.

15. A circuit implementing a symmetric transpose filter in an integrated circuit, the circuit comprising:
a plurality of processing blocks, each processing block having:
a plurality of delay elements;
a pre-adder circuit coupled to receive a first tap of the symmetric transpose filter by way of a first delay element of the plurality of delay elements and a second tap of the symmetric transpose filter by way of a second delay element of the plurality of delay elements, wherein the first tap and the second tap have a common coefficient, wherein the pre-adder circuit has an adder/subtractor coupled to an output of a first logic gate and an output of a second logic gate and is dynamically configured to operate as either an adder or a subtractor based upon control signals during operation of the integrated circuit; and wherein a register depth to an input port of the first logic gate is dynamically selected based upon the control signals during operation of the integrated circuit;

a multiplier coupled to receive an output of the pre-adder circuit comprising a sum of the first tap and the second tap at a first input and the common coefficient at a second input; and an adder coupled to receive the output of the multiplier;

wherein the symmetric transpose filter receives an input signal external to the symmetric transpose filter at a first processing block and each processing block of the plurality of processing blocks after the first processing block is configured to receive the input signal directly at the processing block and a different first tap, and wherein the first processing block receives a highest order coefficient; and wherein, for each processing block, a second input port of the first logic gate and a third input port of the second logic gate provide dynamic power gating of the pre-adder circuit to enable power conservation.

16. The circuit of claim 15 wherein the symmetric transpose filter comprises a transpose convolution filter.

17. The circuit of claim 15 wherein the common coefficient is associated with symmetrical coefficients of the symmetric transpose filter.

18. The circuit of claim 15 wherein the number of taps of the symmetric transpose filter comprises an even number of taps.

19. The circuit of claim 15 wherein the number of taps of the symmetric transpose filter comprises an odd number of taps and a subset of the odd number of taps is coupled to the pre-adder circuit.

20. The circuit of claim 15 wherein the plurality of delay elements, the pre-adder circuit and the multiplier are part of a digital signal processing block of the integrated circuit.

* * * * *